US006991680B2

(12) United States Patent
Kojima

(10) Patent No.: US 6,991,680 B2
(45) Date of Patent: Jan. 31, 2006

(54) LIQUID DROPLET EJECTING APPARATUS, ELECTRO-OPTICAL DEVICE, METHOD OF MANUFACTURING THE ELECTRO-OPTICAL DEVICE, AND ELECTRONIC APPARATUS

(75) Inventor: Kenji Kojima, Suwa (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/739,920

(22) Filed: Dec. 18, 2003

(65) Prior Publication Data

US 2005/0045096 A1 Mar. 3, 2005

(30) Foreign Application Priority Data

Dec. 24, 2002 (JP) .............................. 2002-372955

(51) Int. Cl.
*B05B 15/02* (2006.01)

(52) U.S. Cl. ............................ 118/302; 118/46; 347/33

(58) Field of Classification Search ................ 118/300, 118/302, 46; 347/22, 29, 32, 33
See application file for complete search history.

(56) References Cited

U.S. PATENT DOCUMENTS

2004/0075713 A1 * 4/2004 Takano et al. ................. 347/37
2004/0218002 A1 * 11/2004 Nakamura ..................... 347/33

FOREIGN PATENT DOCUMENTS

| JP | 10-260307 | | 9/1998 |
| JP | 2003200584 A | * | 7/2003 |

OTHER PUBLICATIONS

English translated Abstract of JP2003200584A.*

* cited by examiner

Primary Examiner—Melvin Mayes
Assistant Examiner—Yewebdar Tadesse
(74) Attorney, Agent, or Firm—Harness, Dickey & Pierce, P.L.C.

(57) ABSTRACT

A liquid droplet ejecting apparatus of the present invention includes a cleaning unit, a regular flushing unit, capping unit, and an ejection-amount measuring unit as droplet ejecting head maintenance units used for function maintenance, function recovery, adjustment, or inspection of a liquid ejecting head. The droplet ejecting head maintenance units are arranged in a group in a movable platen as a maintenance-unit installing section. The movable platen is supported by an accessory stand physically separated from a main body.

14 Claims, 23 Drawing Sheets

FIG. 12
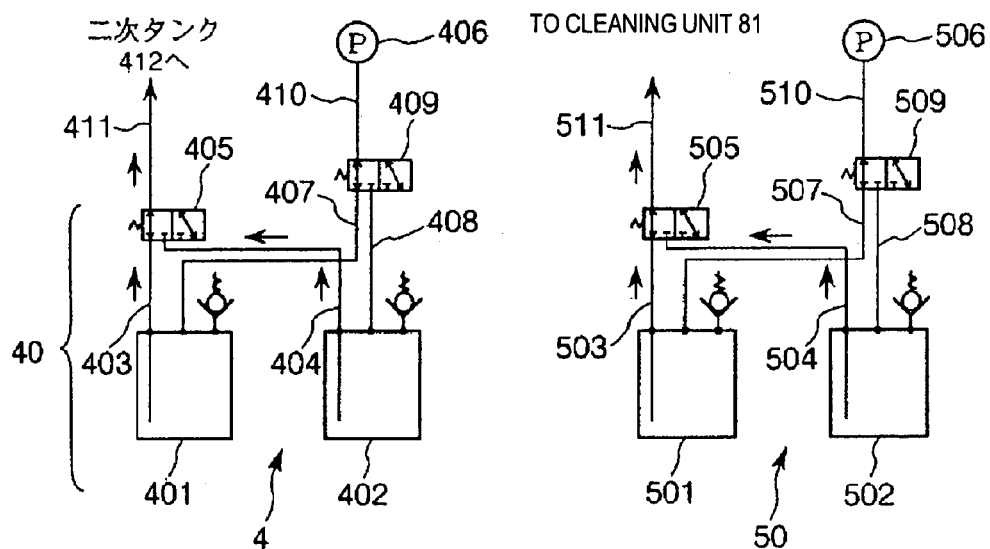
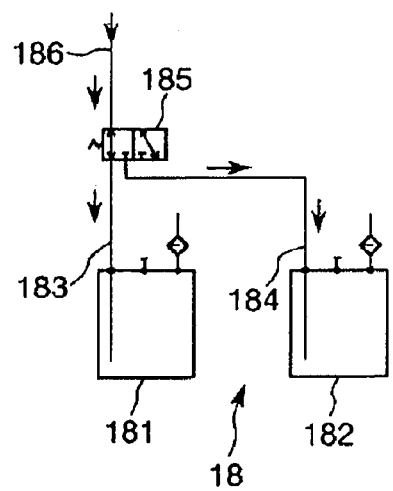

LIQUID DROPLET EJECTING APPARATUS, ELECTRO-OPTICAL DEVICE, METHOD OF MANUFACTURING THE ELECTRO-OPTICAL DEVICE, AND ELECTRONIC APPARATUS

FIELD OF THE INVENTION

The present invention relates to a liquid droplet ejecting apparatus, an electro-optical device, a method of manufacturing the electro-optical device, and an electronic apparatus.

DESCRIPTION OF THE RELATED ART

Industrial liquid droplet ejecting apparatuses (ink-jet imaging apparatuses) are used for manufacturing, for example, color filters for liquid crystal display devices or organic EL (electroluminescent) display devices, or for forming metal wiring lines on substrates, by adapting an ink-jet method (a liquid droplet ejecting method) for ink-jet printers In the liquid droplet ejecting apparatuses, there is a need for providing various units (hereinafter, referred to as droplet ejecting head maintenance units) used for function maintenance, function recovery, adjustment, or inspection of droplet ejecting heads (ink-jet heads). The droplet ejecting head maintenance units can include, for example, a cleaning unit for cleaning a nozzle-formed surface of the droplet ejecting head, a capping unit for suctioning liquid discharged from the droplet ejecting head, etc.

Since the industrial liquid droplet ejecting apparatuses increase in size with an increase in the size of substrates, however, there is a problem in that wide installation spaces are necessary within plants. With an increase in size of the liquid droplet ejecting apparatuses, there is an problem in that an installation space should be secured for each of the various droplet ejecting head maintenance units described above.

Therefore, it is desirable to provide a liquid droplet ejecting apparatus in which the entire space for the apparatus can be effectively utilized by arranging a plurality of droplet ejecting head maintenance units with high spatial efficiency, an electro-optical device manufactured using the liquid droplet ejecting apparatus, a method of manufacturing an electro-optical device using the liquid droplet ejecting apparatus, and an electronic apparatus comprising the electro-optical device.

SUMMARY OF THE INVENTION

The above object is accomplished by the following present invention.

A liquid droplet ejecting apparatus according to the present invention includes: a main body; a work piece mounting unit on which a work piece is mounted; a droplet ejecting head for ejecting liquid droplets of an ejection liquid to the work piece; a relative movement mechanism for relatively moving the work piece mounting unit and the droplet ejecting head; and three or more kinds of droplet ejecting head maintenance units used for function maintenance, function recovery, adjustment, or inspection of the droplet ejecting head, wherein at least three of the droplet ejecting head maintenance units are arranged in a group in a maintenance-unit installing section. As a result, by arranging the plurality of droplet ejecting head maintenance units with high spatial efficiency, it is possible to provide a liquid droplet ejecting apparatus for which the entire space can be effectively utilized. Further, since maintenance by means of various kinds of droplet ejecting head maintenance units in the maintenance-unit installing section can be performed in a group, the cycle time required for one work piece can be shortened, so that it is possible to improve throughput (production efficiency).

It is preferable that the liquid droplet ejecting apparatus according to the present invention include four or more kinds of droplet ejecting head maintenance units, and that at least four droplet ejecting head maintenance units be arranged in a group in the maintenance-unit installing section. As a result, it is possible to more effectively utilize the entire space for the apparatus, and to further improve throughput.

In the liquid droplet ejecting apparatus according to the present invention, it is preferable that each of the droplet ejecting head maintenance units installed in the maintenance-unit installing section be one of a cleaning unit for cleaning a nozzle-formed surface of the droplet ejecting head, a flushing unit having a liquid receiver for receiving liquid wastefully ejected by the droplet ejecting head during a waiting time, a capping unit having a cap for covering a nozzle-formed surface of the droplet ejecting head while suctioning fluid from the droplet ejecting head, an ejection-amount measuring unit used for measuring the amount of liquid droplets ejected from the droplet ejecting head, and a dot-omission detecting unit used for inspecting dot-omission of the droplet ejecting head. As a result, by arranging the cleaning unit, the flushing unit, the capping unit, the ejection-amount measuring unit, and the dot-omission detecting unit with high spatial efficiency, it is possible to effectively utilize the entire space for the apparatus.

In the liquid droplet ejecting apparatus according to the present invention, it is preferable that the droplet ejecting head maintenance units installed in the maintenance-unit installing section be arranged in parallel in a line. As a result, it is possible to more effectively utilize the entire space for the apparatus, and to further improve throughput.

It is preferable that the liquid droplet ejecting apparatus according to the present invention further include a maintenance-unit moving mechanism for horizontally moving the maintenance-unit installing section. As a result, since the degree of freedom regarding the pattern in which the droplet ejecting head maintenance units are arranged in the maintenance-unit installing section is enhanced, it is possible to more effectively utilize the entire space for the apparatus.

In the liquid droplet ejecting apparatus according to the present invention, it is preferable that the droplet ejecting head be detachably provided in the main body, and that the maintenance-unit moving mechanism move the maintenance-unit installing section to a position where the droplet ejecting head maintenance units installed in the maintenance-unit installing section do not interfere with the droplet ejecting head during the attachment or detachment of the droplet ejecting head. As a result, the attachment or detachment of the droplet ejecting head can be performed easily, smoothly and rapidly, so that it is possible to improve workability.

In the liquid droplet ejecting apparatus according to the present invention, it is preferable that the relative movement mechanism comprise an Y-axis movement mechanism for moving the work piece mounting unit in a horizontal direction (hereinafter referred to as a 'Y-axis direction') relative to the main body, and an X-axis movement mechanism for moving the droplet ejecting head in another horizontal direction (hereinafter referred to as an 'X-axis direction')

perpendicular to the Y-axis direction relative to the main body. As a result, various kinds of patterns can be formed (imaged) on the work piece in accordance with its purposes.

In the liquid droplet ejecting apparatus according to the present invention, it is preferable that the liquid droplets be ejected to the work piece from the droplet ejecting head while relatively moving the work mounting unit and the droplet ejecting head, using either the Y-axis direction or the X-axis direction as the primary scanning direction and the other as the secondary scanning direction. As a result, various patterns can be formed (imaged) on the work in accordance with its purposes.

It is preferable that the liquid droplet ejecting apparatus according to the present invention further include a maintenance-unit moving mechanism for moving the maintenance-unit installing section in the Y-axis direction, and that the droplet ejecting head maintenance units installed in the maintenance-unit installing section be arranged in a line along the Y-axis direction. As a result, it is possible to more effectively utilize the entire space for the apparatus, and to further improve throughput.

It is preferable that the liquid droplet ejecting apparatus according to the present invention further include a height adjusting mechanism for adjusting the height of the maintenance-unit installing section. As a result, it is possible to easily cope with a change in height of the droplet ejecting head due to a change in thickness of the work piece to be manufactured (processed).

In the liquid droplet ejecting apparatus according to the present invention, it is preferable that the work piece mounting unit, the droplet ejecting head, and the relative movement mechanism be supported by the main body, and that the maintenance-unit installing section be supported by an accessory stand physically separated from the main body. As a result, vibrations generated from the accessory stand side can be prevented from being transferred to the main body side. As such, it is possible to avoid an adverse effect on the accuracy of the pattern to be formed (imaged) on the work piece.

In the liquid droplet ejecting apparatus according to the present invention, it is preferable that the main body have a surface plate, and that the work piece mounting unit, the droplet ejecting head, and the relative movement mechanism be supported by the surface plate. As a result, it is possible to form (image) a pattern with high accuracy on the work piece.

In the liquid droplet ejecting apparatus according to the present invention, it is preferable that a side surface of the accessory stand be provided with relevant piping components used for the liquid droplet ejecting apparatus, and that the relevant piping components be provided to not protrude outwardly from the total width of the accessory stand by fixing the relevant piping components to fixed sections provided at positions receding inwardly from the total width of the accessory stand. As a result, when an operator works in the vicinity of the accessory stand, it is possible to easily and smoothly work without interference with the relevant piping components.

In the liquid droplet ejecting apparatus according to the present invention, it is preferable that a predetermined pattern be formed on the work piece by ejecting the liquid droplets from the droplet ejecting head while relatively moving the work piece mounting unit and the droplet ejecting head.

As a result, various patterns can be formed (imaged) on the work piece in accordance with its purposes.

An electro-optical device according to the present invention is manufactured using the liquid droplet ejecting apparatus according to the present invention. As a result, it is possible to provide an electro-optical device having high-performance elements on which patterns are formed (imaged) with high accuracy, and having a low manufacturing cost.

A method of manufacturing an electro-optical device according to the present invention employs the liquid droplet ejecting apparatus according to the present invention. As a result, it is possible to provide a method of manufacturing an electro-optical device, wherein patterns can be formed (imaged) on the work piece with high accuracy, and its manufacturing cost can be reduced.

An electronic apparatus according to the present invention comprises the electro-optical device according to the present invention. As a result, it is possible to provide an electronic apparatus having high-performance elements, on which patterns are formed (imaged) with high accuracy, and having a low manufacturing cost.

BRIEF DESCRIPTION OF THE DRAWINGS

FIG. 12 is a piping system diagram illustrating an ejection liquid supply unit, a cleaning solution supply unit, and a liquid discharging unit according to a principle of the present invention;

DETAILED DESCRIPTION OF THE PREFERRED EMBODIMENTS

Now, a liquid droplet ejecting apparatus according to the present invention will be described in detail and in conjunction with the preferred embodiments shown in the accompanying drawings.

Figure 1:
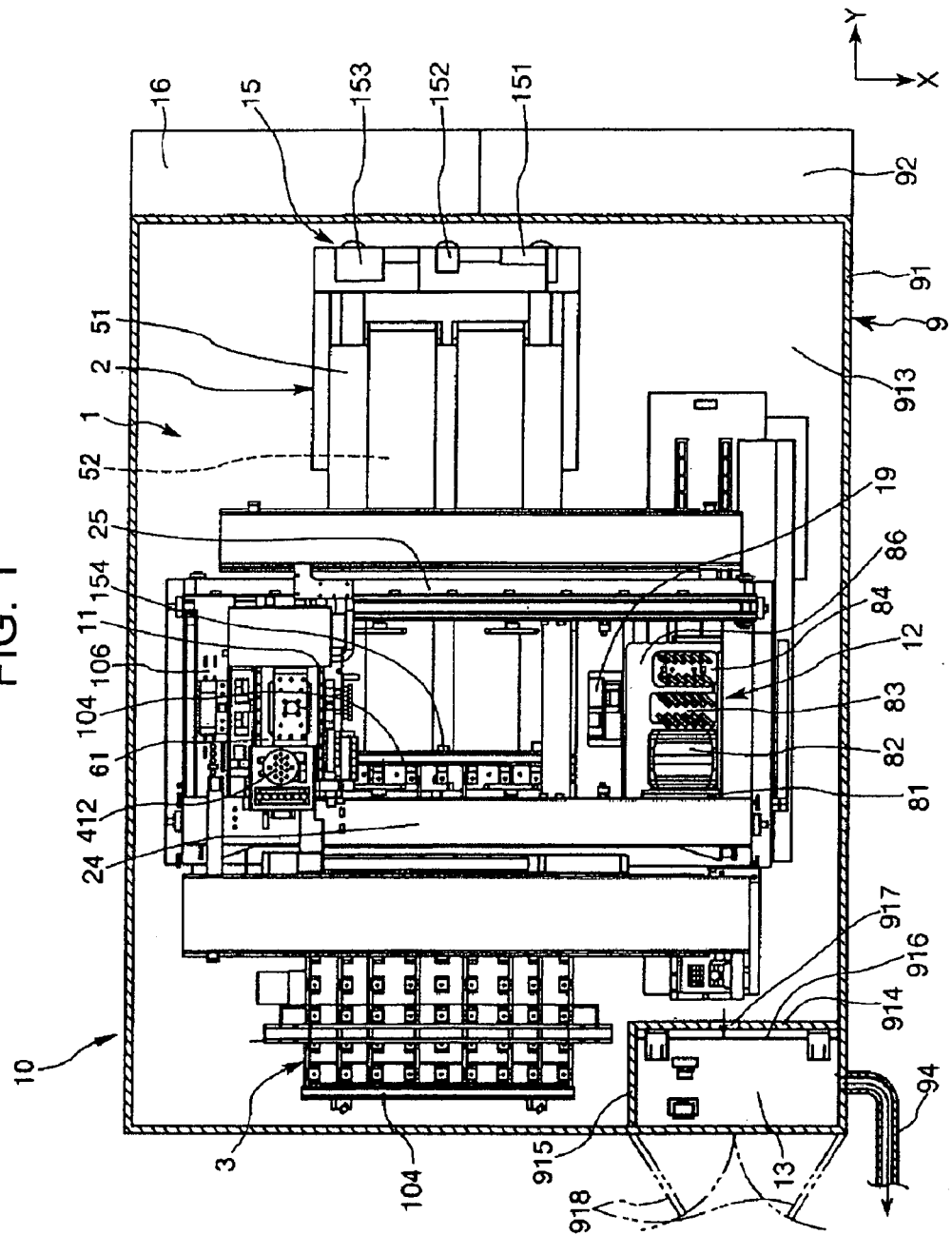
FIG. 1 is a plan view illustrating an embodiment of a liquid droplet ejecting apparatus according to a principle of the present invention.
Figure 2:
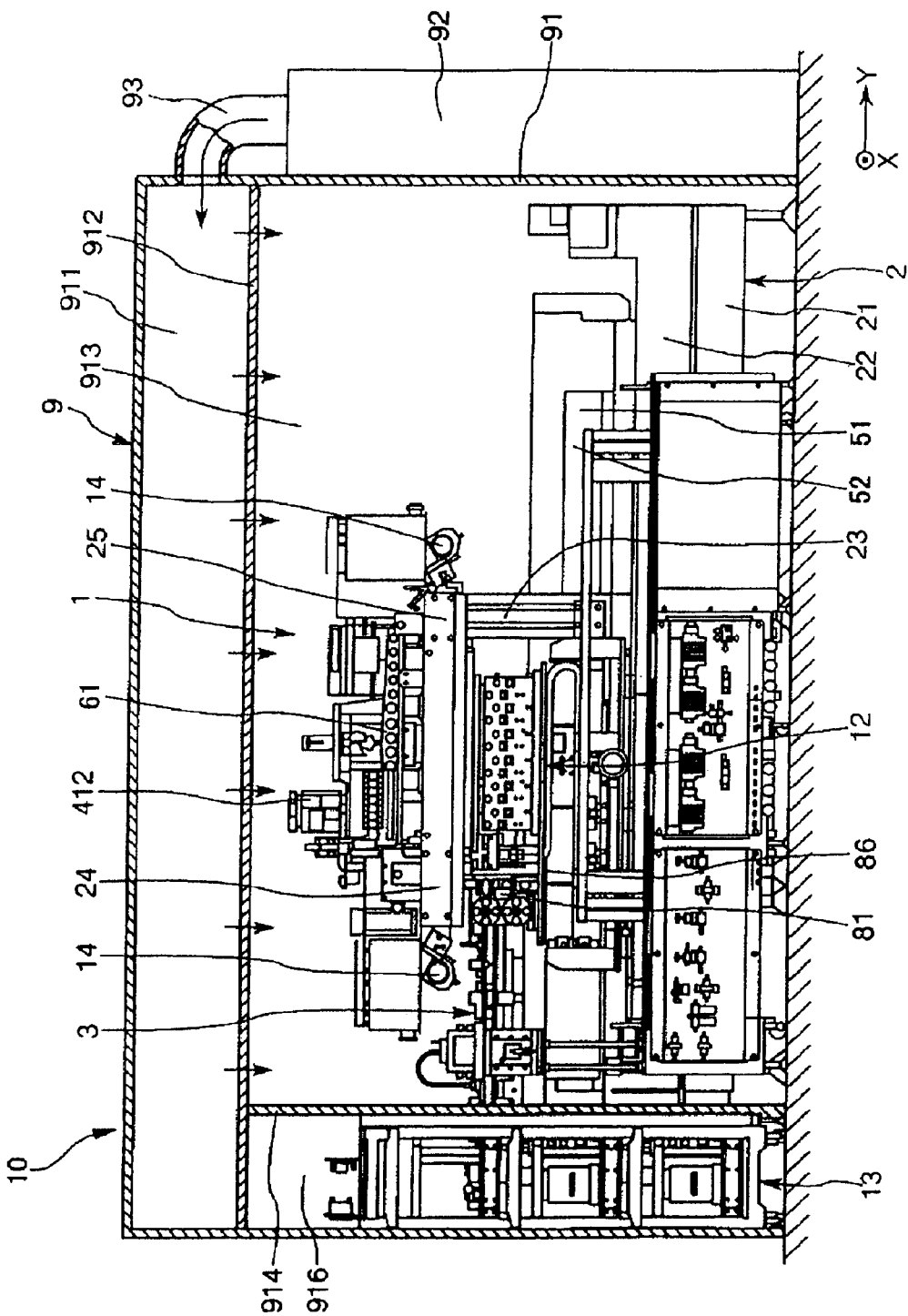
FIG. 2 is a side view illustrating an embodiment of a liquid droplet ejecting apparatus according to a principle of the present invention.
Figure 9:
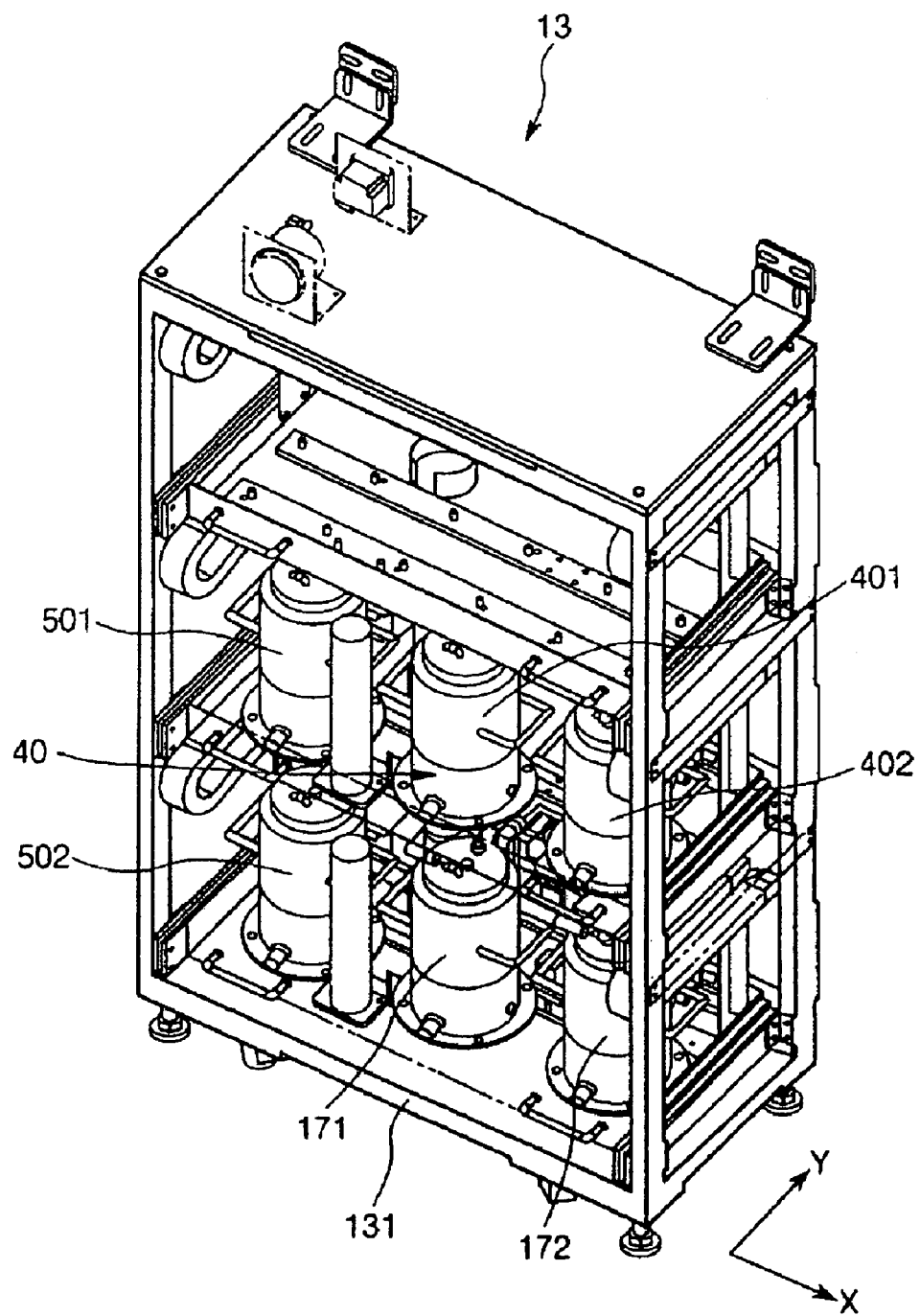
FIG. 9 is a perspective view illustrating a tank housing unit according to a principle of the present invention.

FIGS. 1 and 2 are a plan view and a side view illustrating an embodiment of a liquid droplet ejecting apparatus according to the present invention, respectively; and FIG. 9 is a perspective view illustrating a tank housing unit in the liquid droplet ejecting apparatus shown in FIGS. 1 and 2. Hereinafter, for the purpose of convenient explanation, one horizontal direction (the direction corresponding to the right-left direction in FIGS. 1 and 2) is referred to as a 'Y-axis direction', and another horizontal direction (the direction corresponding to an up-down direction in FIG. 1), perpendicular to the Y-axis direction, is referred to as an 'X-axis direction'. Further, in the Y-axis direction, movement to the right in FIGS. 1 and 2 is referred to as 'Y-axis advancement', and movement to the left in FIGS. 1 and 2 is referred to as 'Y-axis retreat'. Furthermore, in the X-axis direction, downward movement in FIG. 1 is referred to as 'X-axis advancement', and upward movement in FIG. 1 is referred to as 'X-axis retreat'.

A liquid droplet ejecting system 10 shown in FIGS. 1 and 2 comprises a liquid droplet ejecting apparatus (an ink-jet imaging apparatus) 1 having droplet ejecting heads 111 and a chamber (a chamber room) 91 for housing the liquid droplet ejecting apparatus 1.

The liquid droplet ejecting apparatus 1 is an apparatus for ejecting liquid (liquid to be ejected) such as ink, functional liquid containing target materials, etc., in a minute liquid droplet state to a substrate W as a work piece by using an ink-jet method (a liquid droplet ejecting method) to form (image) a predetermined pattern, and for manufacturing an organic EL display device or a color filter for a liquid crystal display device, or for forming metal wiring lines on a substrate. The material of the substrate W is not particularly limited, and the substrate may include any plate-shaped member, such as a glass substrate, a silicon substrate, a flexible substrate, etc.

A work piece in the present invention is not limited to the plate-shaped member, and may include any member having a flat bottom surface. For example, the present invention can be applied to a liquid droplet ejecting apparatus, etc., for forming a coating film, such as an optical thin film, by using a lens as a work piece and ejecting liquid droplets to the lens. The present invention can be applied particularly preferably to a relatively large liquid droplet ejecting apparatus 1 which can cope with a relatively large work piece (for example, a work piece having a length and a width ranging from several tens of centimeters to several meters).

The liquid droplet ejecting apparatus 1 comprises a main body 2, a substrate carrying table (a substrate carrying stage) 3 as a work piece mounting unit, a head unit 11 having a plurality of droplet ejecting heads (ink-jet heads) 111, an accessory apparatus (a maintenance apparatus) 12 provided at the side of the main body 2, a tank housing unit 13, a blow unit 14 for emitting a gas to a substrate W, a length-measuring laser unit 15 for measuring the moved length of the substrate carrying table 3, and a dot-omission detecting unit 19.

The ejection liquid to be ejected from the droplet ejecting heads 111 is not particularly limited, and may include liquid (including a dispersed liquid, such as a suspension, an emulsion, etc.) containing, for example, the following various materials in addition to an ink containing filter materials for a color filter: a light-emitting material for forming an EL light-emitting layer in an organic EL (electroluminescence) device; a fluorescent material for forming a fluorescent layer on an electrode in an electron-emitting device; a fluorescent material for forming a fluorescent layer in a PDP (Plasma Display Panel) device; an electrophoretic material for forming an electrophoretic layer in an electrophoresis display device; a bank material for forming a bank on a surface of a substrate W; various kinds of coating materials; a liquid-state electrode material for forming an electrode; a particle material for forming a spacer for forming a fine cell gap between two sheets of substrates; a liquid-state metal material for forming a metal wire; a lens material for forming a micro lens; a resist material; and a light-diffusing material for forming a light diffusing layer.

As shown in FIG. 2, the main body 2 has a trestle 21 provided on the floor and a stone surface plate (a surface plate) 22 provided on the trestle 21. The substrate-carrying table 3 is provided on the stone surface plate 22 to be movable in the Y-axis direction with respect to the main body 2. The substrate-carrying table 3 advances and retreats in the Y-axis direction by means of driving of a linear motor 51.

The substrate W is mounted on the substrate-carrying table 3.

The liquid droplet ejecting apparatus 1 may use substrates W having various sizes and shapes, including substrates ranging from a relatively large substrate W, having the same size as the substrate-carrying table 3, to a relatively small substrate W that is smaller than the substrate-carrying table 3. It is generally preferable that the liquid droplet ejecting operation be performed in a state where the centers of the substrate W and the substrate-carrying table 3 are aligned, but, in a case of the relatively small substrates W, the liquid droplet ejecting operation may be performed in a state where the substrates are positioned close to the edge portions of the substrate-carrying table 3.

As shown in FIG. 1, in the vicinities of the two sides along the X-axis direction of the substrate-carrying table 3, a before-imaging flushing unit 104 for receiving liquid droplets wastefully ejected (also referred to as preliminarily ejected or flushed) from the droplet ejecting heads 111 before the ejection of liquid droplets (imaging) to the substrate W is provided. A suction tube (not shown) is connected to the before-imaging flushing unit 104, and the wastefully ejected liquid is recovered and stored through the suction tube by a liquid discharging unit 18 to be described later.

The moved length of the substrate-carrying table 3 in the Y-axis direction is measured by the length-measuring laser unit 15 as a moved length detecting means. The length-measuring laser unit 15 has a length-measuring laser sensor head 151, a mirror 152, and a length-measuring laser unit body 153 provided on the main body 2 side, and a corner cube 154 provided on the substrate-carrying table 3 side. Laser rays emitted from the length-measuring laser sensor head 151 along the X axis are bent by the mirror 152, advance in the Y-axis direction, and are irradiated to the corner cube 154. The reflected ray from the corner cube 154 returns to the length-measuring laser sensor head 151 via the mirror 152. In the liquid droplet ejecting apparatus 1, based on the moved length (the current position) of the substrate-carrying table 3 detected by the length-measuring laser unit 15, the ejection timing from the droplet ejecting heads 111 is generated.

A main carriage 61 supporting the head unit 11 is provided in the main body 2 to be movable in the X-axis direction in a space above the substrate-carrying table 3. The head unit 11, having a plurality of droplet ejecting heads 111, advances and retreats in the X-axis direction, together with the main carriage 61 by way of driving a linear motor actuator 62 comprising a linear motor and a guide.

In a so-called primary scanning of the droplet ejecting heads 111 in the liquid droplet ejecting apparatus 1 according to the present embodiment, the droplet ejecting heads 111 are driven (the liquid droplets are selectively ejected) on the basis of the ejection timing generated using the length-measuring laser unit 15, while moving the substrate-carrying table 3 in the Y-axis direction. Correspondingly thereto, a so-called secondary scanning is performed by means of the movement of the head unit 11 (the droplet ejecting heads 111) in the X-axis direction.

A blow unit 14 for semi-drying the liquid droplets ejected to the substrate W is provided in the main body 2. The blow unit 14 has a nozzle opened in a slit shape along the X-axis direction, and emits gas to the substrate W from the nozzle while carrying the substrate W in the Y-axis direction by means of the substrate-carrying table 3. In the liquid droplet ejecting apparatus 1 according to this embodiment, two blow units 14 positioned at positions separated from each other in the Y-axis direction are provided.

In the vicinity of the main body 2 and the accessory apparatus 12, a tank housing unit 13 having a rack 131 is provided. As shown in FIG. 9, a first primary tank (an ejection liquid tank) 401, a second primary tank (an ejection liquid tank) 402, a first cleaning solution tank 501, a second cleaning solution tank 502, a first reuse tank 171, a second reuse tank 172, a first discharged liquid tank 181, and a second discharged liquid tank 182 are provided (housed) on the rack 131 of the tank housing unit 13. (The first discharged liquid tank 181 and the second discharged liquid tank 182 are not shown in FIG. 9). Further, although two primary tanks are provided in this embodiment, one primary tank or three or more primary tanks may be provided (the same is also true of other tanks).

The first primary tank 401 and the second primary tank 402 store the ejection liquid to be ejected from the droplet ejecting heads 111. The first cleaning solution tank 501 and the second cleaning solution tank 502 store the cleaning solution to be supplied to a cleaning unit 81 that will be described later. The first reuse tank 171 and the second reuse tank also 172 store the ejection liquid to be recovered from a capping unit 83 that will be described later. The first discharged liquid tank 181 and the second discharged liquid tank 182 store the ejection liquid ejected from the droplet ejecting heads 111 in the before-imaging flushing unit 104, a regular flushing unit 82 that will be described later, and a dot-omission detecting unit 19 that will also be described later.

The first primary tank 401 and the second primary tank 402 can be filled up with the ejection liquid or can be replaced with a full tank when they are empty. That is, any one of the replacement (detachment or attachment) or fill-up of the ejection liquid may be performed on the first primary tank 401 and the second primary tank 402.

Similarly, the first cleaning solution tank 501 and the second cleaning solution tank 502 may also be subjected to replacement or fill-up. The first reuse tank 171, the second reuse tank 172, the first discharged liquid tank 181, and the second discharged liquid tank 182, respectively, may be subjected to replacement with empty tanks, or extraction of the inner liquid when they are full.

As shown in FIG. 1, the dot-omission detecting unit 19 is fixed to a position which is not superposed with the moving area of the substrate-carrying table 3 on the stone surface plate 22; and which is below the moving area of the head unit 11. The dot-omission detecting unit 19 performs a dot-omission inspection (an ejection confirming inspection) for inspecting (detecting) a dot-omission resulting from the clogging of an ejecting nozzle of the droplet ejecting head 111. The dot-omission detecting unit 19 comprises, for example, a light-emitting portion and a light-receiving portion for emitting and receiving a laser ray and a dot-omission inspecting liquid receiver.

When the dot-omission inspection is performed, the liquid droplets are ejected from respective ejecting nozzles of the droplet ejecting heads 111 while the head unit 11 moves in the X-axis direction in a space above the dot-omission detecting unit 19. The dot-omission detecting unit 19 performs the light-emitting and light-receiving process on the ejected liquid droplets to optically detect the clogging of the ejecting nozzles and their positions. Liquid (liquid droplet) ejected from the droplet ejecting head 111 in the dot-omission inspection is received by the dot-omission inspecting liquid receiver.

A suction tube (not shown) is connected to the bottom of the dot-omission inspecting liquid receiver, and the liquid received by the dot-omission inspecting liquid receiver is restored by a liquid discharging unit 18, which will be described later, through the suction tube, and stored in the first discharged liquid tank 181 and the second discharged liquid tank 182.

The dot-omission inspection employing the dot-omission detecting unit 19 can be performed by, for example, a method described in Japanese Unexamined Patent Application Publication No. 2002-192740, but it is not limited to the method and may be performed by other methods.

In the vicinity of the liquid droplet ejecting apparatus 1, a control unit (control means) 16 is provided. The control unit 16 controls all of the elements of the liquid droplet ejecting apparatus 1 and has a CPU (Central Processing Unit) and a memory unit for storing various programs, such as programs for executing the control operation of the liquid droplet ejecting apparatus 1, and various data. In the illustrated configuration, the control unit 16 is provided outside the chamber 91 that will be described later.

The liquid droplet ejecting apparatus 1 preferably performs the ejection of liquid droplets (imaging) on the substrate W in an atmosphere in which the temperature and humidity are managed by a chamber unit 9. The chamber unit 9 has a chamber 91 for housing the liquid droplet ejecting apparatus 1 and an air-conditioning system 92 provided outside the chamber 91. The air conditioning system 92 has a known air-conditioner therein and adjusts the temperature and humidity of air, and transfers the adjusted air to a space 911 under the roof of the chamber 91 through an inlet duct 93. The air transferred to the space 911 under the roof from the air-conditioning system 92 passes through a filter 912 provided below the roof, and goes into the main room 913 of the chamber 91.

In the chamber 91, an auxiliary room 916, in addition to the main room 913, is provided by means of partition walls 914 and 915, and the tank housing unit 13 is provided in the auxiliary room 916. A communicating portion (a passage) 917 for communication of the main room 913 with the auxiliary room 916 is formed in the partition wall 914.

The auxiliary room 916 is provided with an opening and closing door (an opening and closing portion) 918 to the outside of the chamber 91 (see FIG. 1). The opening and closing portion of the auxiliary room 916 is not limited to a hinged door, such as the opening and closing door 918, and may be a sliding door, a shutter, etc.

A discharging outlet for discharging gas in the auxiliary room 916 is formed in the auxiliary room 916, and an outlet duct 94 extending outwardly is connected to the discharging outlet. The air in the main room 913 flows into the auxiliary room 916 through the communicating portion 917, and is then discharged to the outside of the chamber unit 9 through the outlet duct 94.

Since the temperature and humidity around the liquid droplet ejecting apparatus 1 are managed by means of the chamber unit 9, it is possible to prevent errors resulting from the expansion and contraction of the elements or the substrate W due to a variation in temperature, and thus to image (form) the pattern with high accuracy on the substrate W with the liquid droplets. Further, since the tank housing unit 13 is also placed in an environment in which the temperature and humidity are managed, a characteristic, such as viscosity of the ejection liquid, is stabilized so that it is possible to form (image) a pattern with high accuracy with the liquid droplets. Since the infiltration of dust, etc., into the chamber 91 can be prevented, it is possible to keep the substrate W clean.

The inside of the chamber 91 is supplied and filled with a gas other than air (for example, an inert gas, such as nitrogen, carbon dioxide, helium, neon, argon, krypton, xenon, radon, etc.) by way of conditioning the gas, and then, in the atmosphere of the chosen gas, the liquid droplet ejecting apparatus 1 may be operated.

In the liquid droplet ejecting system 10, the tank housing unit 13 can be accessed without exposing the main room 913 to the outside by opening the opening and closing door 918. As a result, since the managed temperature and humidity around the liquid droplet ejecting apparatus 1 are not disturbed in accessing the tank housing unit 13, it is possible to form (image) a pattern with high accuracy, even immediately after performing a replacement of the tanks, a fill-up, or recovery of the liquid. Since it is not necessary to wait until the temperature in the main room 913 or the temperatures of the elements of the liquid droplet ejecting apparatus 1 are restored to a managed value after performing a replacement of the tanks, a fill-up, or recovery of the liquid, it is possible to enhance throughput (production efficiency). As a result, it is very advantageous for mass-producing work pieces, such as substrates W, with high accuracy, and thus it is possible to reduce the manufacturing cost.

Figure 3:
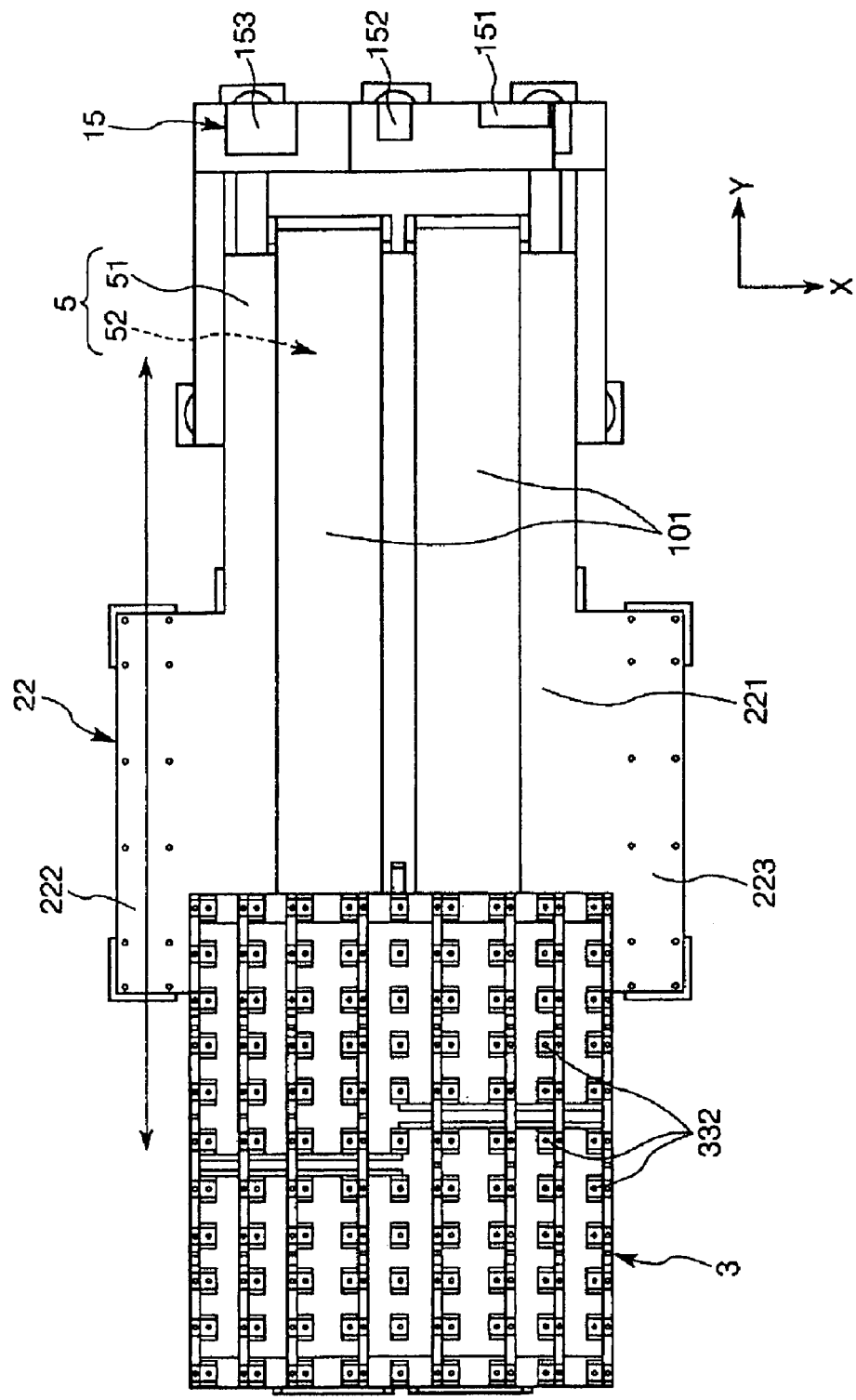
FIG. 3 is a plan view illustrating a trestle, a stone surface plate, and a substrate-carrying table according to a principle of the present invention.
Figure 4:
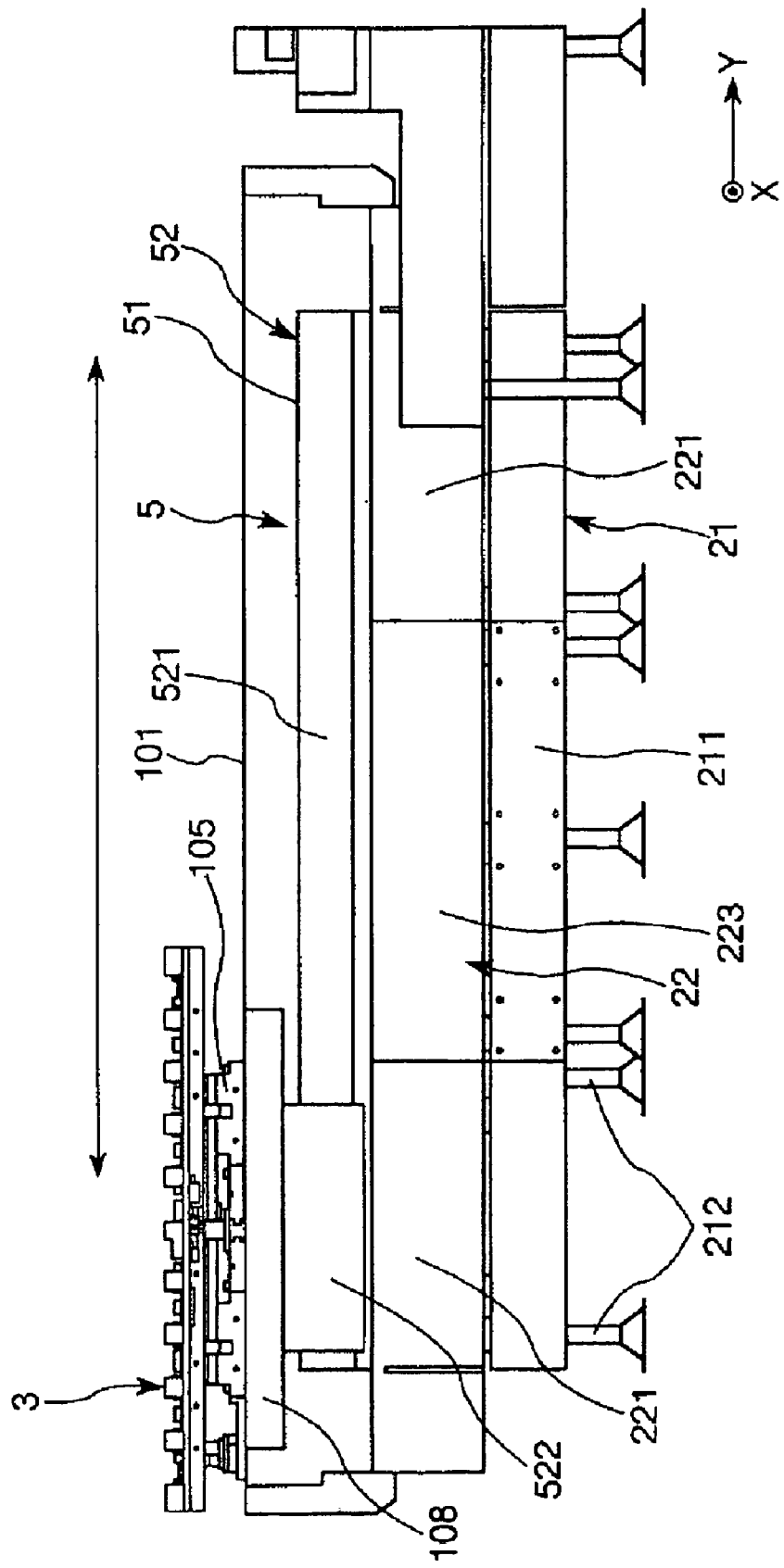
FIG. 4 is a side view illustrating a trestle, a stone surface plate, and a substrate-carrying table according to a principle of the present invention.

FIG. 3 is a plan view illustrating the trestle, the stone surface plate, and the substrate-carrying table in the liquid droplet ejecting apparatus shown in FIGS. 1 and 2; and FIG. 4 is a side view illustrating the trestle, the stone surface plate, and the substrate-carrying table in the liquid droplet ejecting apparatus shown in FIGS. 1 and 2.

As shown in FIGS. 3 and 4, the substrate-carrying table 3 and the Y-axis movement mechanism 5 for moving the substrate-carrying table 3 in the Y-axis direction are provided on the stone surface plate 22. As shown in FIG. 3, a plurality of suction holes (suctioning portions) 332 for suctioning and fixing the mounted substrate W are formed in the substrate-carrying table 3.

As shown in FIG. 4, the Y-axis movement mechanism 5 has a linear motor 51 and an air slider 52. The air slider 52 has a slide guide 521 extending in the Y-axis direction on the stone surface plate 22 and a slide block 522 movable along the slide guide 521. The slide block 522 has an air-emitting port for emitting air between the slide block and the slide guide 521, and can be smoothly moved by interposing the air emitted from the air-emitting port between the slide block 522 and the slide guide 521.

A base 108 is fixed onto the slide block 522, and the substrate-carrying table 3 is fixed onto the base 108 with a θ axial rotation mechanism 105 therebetween. In this way, the substrate-carrying table 3 is supported by the air slider 52 to be smoothly movable in the Y-axis direction, and can be moved in the Y-axis direction by means of operating the linear motor 51. The substrate-carrying table 3 is rotatable within a predetermined range about the vertical θ axis passing through the center of the substrate carrying table 3 by means of the θ axial rotation mechanism 105.

Above the Y-axis movement mechanism 5, a pair of band-shaped thin plates 101 made of a metal material, such as stainless steel, are provided to cover the Y-axis movement mechanism 5. The thin plates 101 pass through a concave portion (groove) formed in the upper surface of the base 108, and are inserted between the base 108 and the θ axial rotation mechanism 105. The ejection liquid ejected from the droplet ejecting heads 111 can be prevented from being attached to the Y-axis movement mechanism 5 by providing the thin plates 101, thereby protecting the Y-axis movement mechanism 5.

The stone surface plate 22 is formed out of immaculate stone, and its upper surface has high flatness. The stone surface plate 22 is excellent in various characteristics, such as stability against a variation in an environmental temperature, an attenuation characteristic against vibration, stability against secular variation (deterioration), and corrosion resistance against the ejection liquid. In this embodiment, by allowing the substrate-carrying table 3, the Y-axis movement mechanism 5, and the X-axis movement mechanism 6, which will be described later, to be supported by the stone surface plate 22, errors due to variation in environmental temperature, vibration and secular variation (deterioration) are small. As such, the relative movement of the substrate-carrying table 3 and the head unit 11 (the droplet ejecting heads 111) can be performed with high accuracy, and the high accuracy can be stably maintained. As a result, it is possible to form (image) a pattern from the liquid droplets with higher accuracy and with stability. The stone material forming the stone surface plate 22 is not particularly limited, and may preferably be one of Belfast Black, Rustenberg, Kurnool, and Indian Black. Accordingly, the aforementioned characteristics of the stone surface plate 22 can be improved.

The stone surface plate 22 is supported by the trestle 21. The trestle 21 has a frame 211 formed of a square shape out of an angle, etc., and a plurality of support legs 212 distributed and arranged under the frame 211. Preferably, the trestle 21 has a vibration-proof structure employing an air spring or a rubber bush, so that vibration from the floor can be prevented from being transferred to the stone surface plate 22.

The stone surface plate 22 is preferably supported by (mounted on) the trestle 21 in a state not coupled (not fixed) to the trestle 21. As a result, it is possible to avoid the influence of heat expansion, etc., generated in the trestle 21 on the stone surface plate 22, so that it is possible to form (image) a pattern with the liquid droplets with higher accuracy.

In this embodiment, as seen two-dimensionally, the stone surface plate 22 comprises a Y-axis movement mechanism support 221 having a longitudinal rectangular shape in the Y-axis direction, and pillar supports 222 and 223 protruding toward both sides in the X-axis direction from middle portions of the longitudinal sides of the Y-axis movement mechanism support 221. As a result, the stone surface plate 22 has a cross shape as seen two-dimensionally. In other words, the stone surface plate 22 has a shape obtained by removing the four corner portions from a rectangular shape, as seen two-dimensionally. On the pillar supports 222 and 223, four pillars 23 that will be described later are provided. That is, the stone surface plate 22 has a shape obtained by removing portions not formed with the Y-axis movement mechanism 5 and the pillars 23 from a rectangular shape, as seen two-dimensionally.

As a result, since the weight of the stone surface plate 22 decreased and the area occupied with the stone surface plate 22 can be reduced, it is possible to facilitate transfer of the liquid droplet ejecting apparatus 1 to an installing place thereof, to reduce the load resistance of the floor in the installing place of a plant, and to decrease the area occupied with the liquid droplet ejecting system 10 in the plant. The stone surface plate 22 according to this embodiment may be made of one stone piece, or may be formed by combining a plurality of stone pieces.

Figure 5:
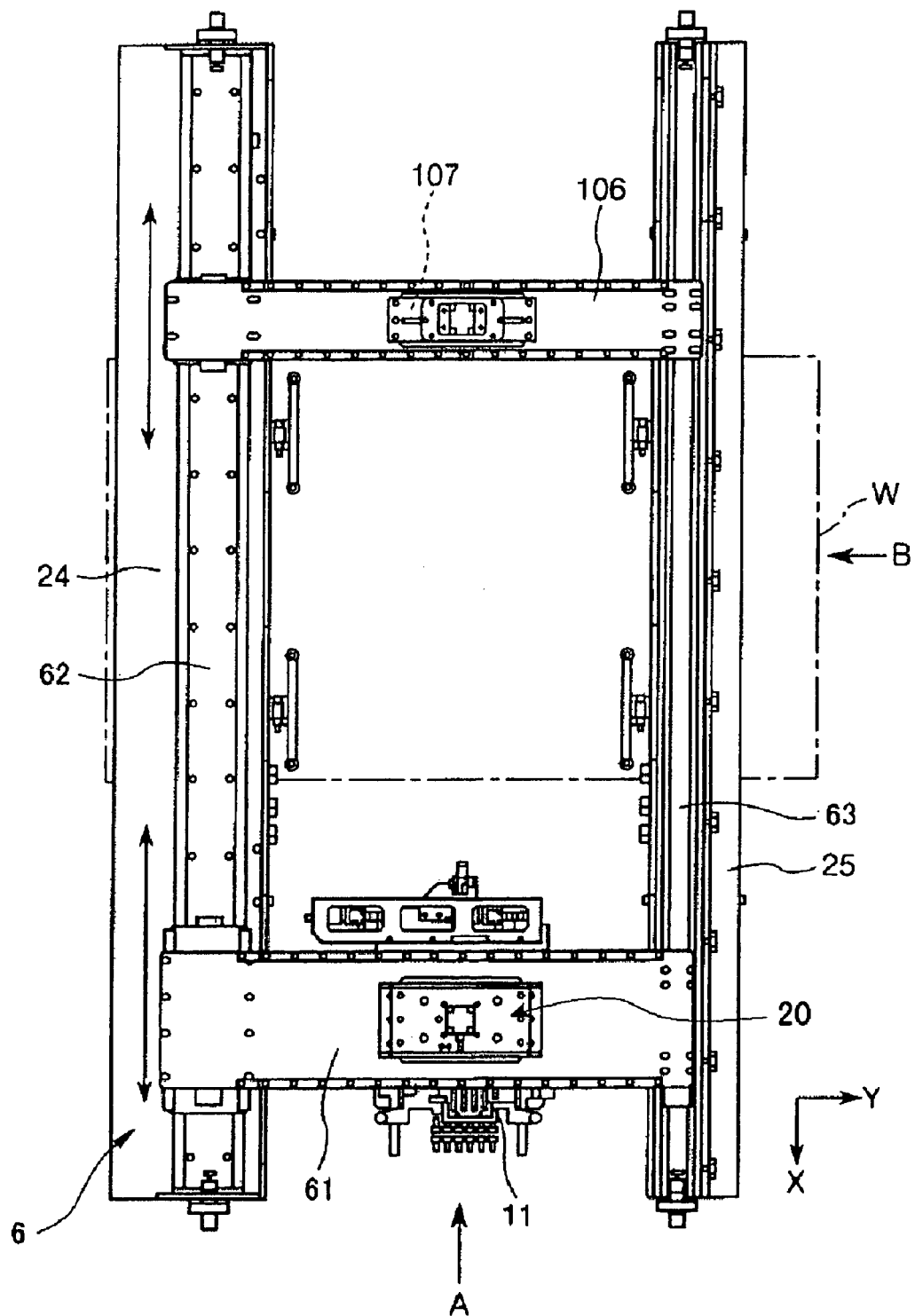
FIG. 5 is a plan view illustrating a head unit and an X-axis movement mechanism according to a principle of the present invention.
Figure 6:
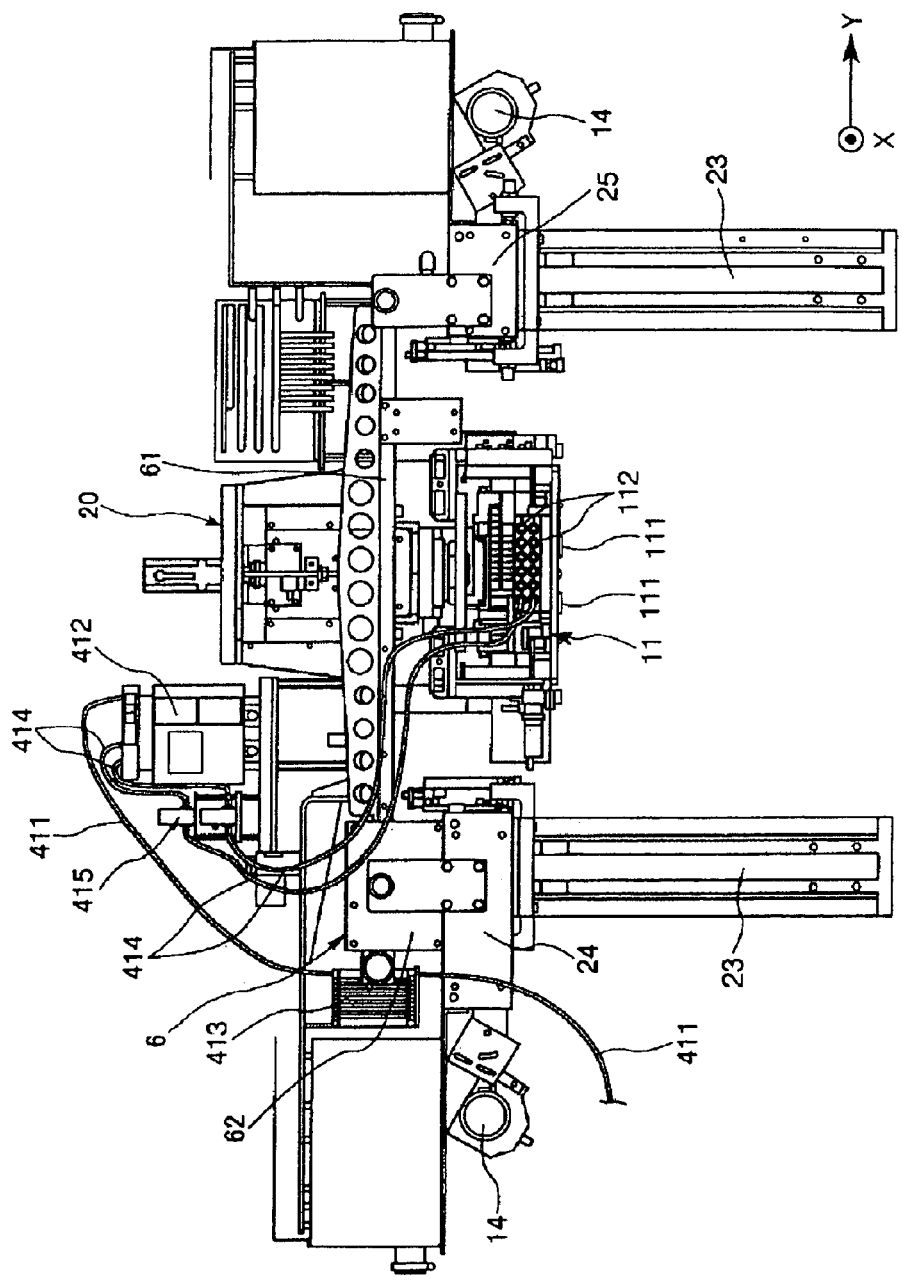
FIG. 6 is a side view seen from an arrow A in FIG. 5.
Figure 7:
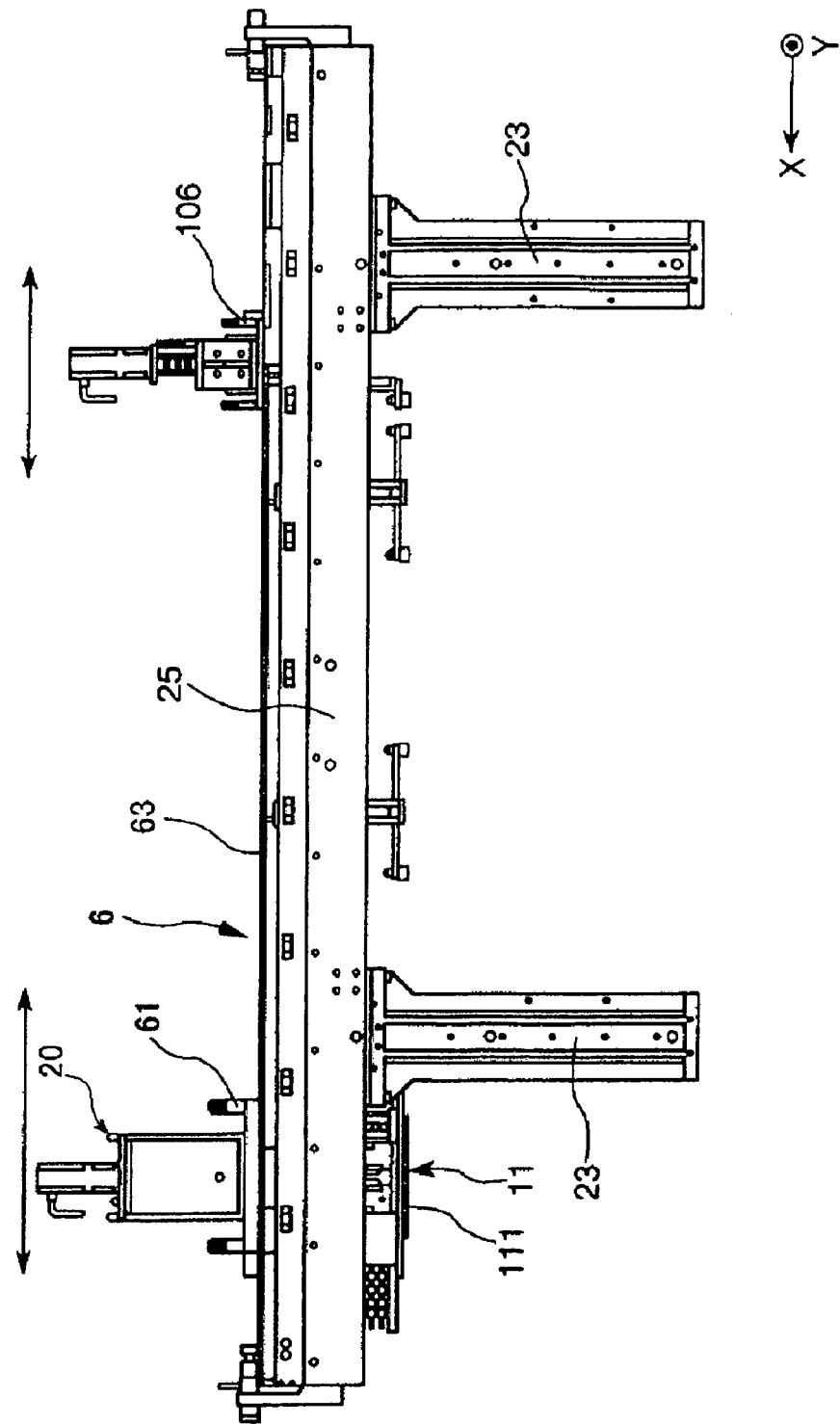
FIG. 7 is a front view seen from an arrow B in FIG. 5.

FIG. 5 is a plan view illustrating the head unit and the X-axis movement mechanism in the liquid droplet ejecting apparatus shown in FIGS. 1 and 2, FIG. 6 is a side view as seen from an arrow A in FIG. 5, and FIG. 7 is a front view as seen from an arrow B in FIG. 5.

As shown in FIGS. 6 and 7, the total of four pillars 23, of which two pillars are opposite to two pillars through the Y-axis movement mechanism 5, and two parallel bars 24 and 25 extending in the X-axis direction and supported by the pillars 23 are provided on the stone surface plate 22 (the pillar supports 222 and 223). The substrate-carrying table 3 can pass below the bars 24 and 25.

The X-axis movement mechanism 6 for moving the droplet ejecting heads 111 (the head unit 11) in the X-axis direction is supported through the bars 24 and 25 by the four pillars 23. As shown in FIG. 5, the X-axis movement mechanism 6 has a main carriage (a head unit support) 61 for supporting the head unit 11, a linear motor actuator 62 that is provided on the bar 24 and guides and drives the main carriage 61 in the X-axis direction, and a guide 63 that is provided on the bar 25 and guides the main carriage 61 in the X-axis direction. The main carriage 61 is laid over the linear motor actuator 62 and the guide 63.

In this embodiment, the Y-axis movement mechanism 5 and the X-axis movement mechanism 6 constitute a relative movement mechanism for relatively moving the substrate-carrying table 3 and the droplet ejecting heads 111 (the head unit 11).

The head unit 11 is detachably supported by the main carriage 61. By moving the head unit 11 together with the main carriage 61 in the X-axis direction, the secondary scanning of the droplet ejecting heads 111 is performed. The head unit 11 is supported by the main carriage 61 through a head unit height adjusting mechanism 20 for adjusting the height of the head unit 11 from the main carriage 61. As a result, in accordance with the thickness of the substrate W, a gap between the nozzle-formed surfaces of the droplet ejecting heads 111 and the substrate W can be adjusted.

As shown in FIG. 7, the linear motor actuator 62 and the guide 63 extend outwardly over the pillars 23. Accordingly, the head unit 11 can be moved over the accessory apparatus 12 that will be described later.

A camera carriage 106 is laid over the linear motor actuator 62 and the guide 63. The camera carriage 106 shares the linear motor actuator 62 and the guide 63 with the main carriage 61, and is moved in the X-axis direction independently from the main carriage 61.

A recognition camera 107 for recognizing images of alignment marks formed at predetermined places on the substrate W is provided in the camera carriage 106. The recognition camera 107 is suspended downwardly from the camera carriage 106. The recognition camera 107 may be used for another purpose.

Figure 8:
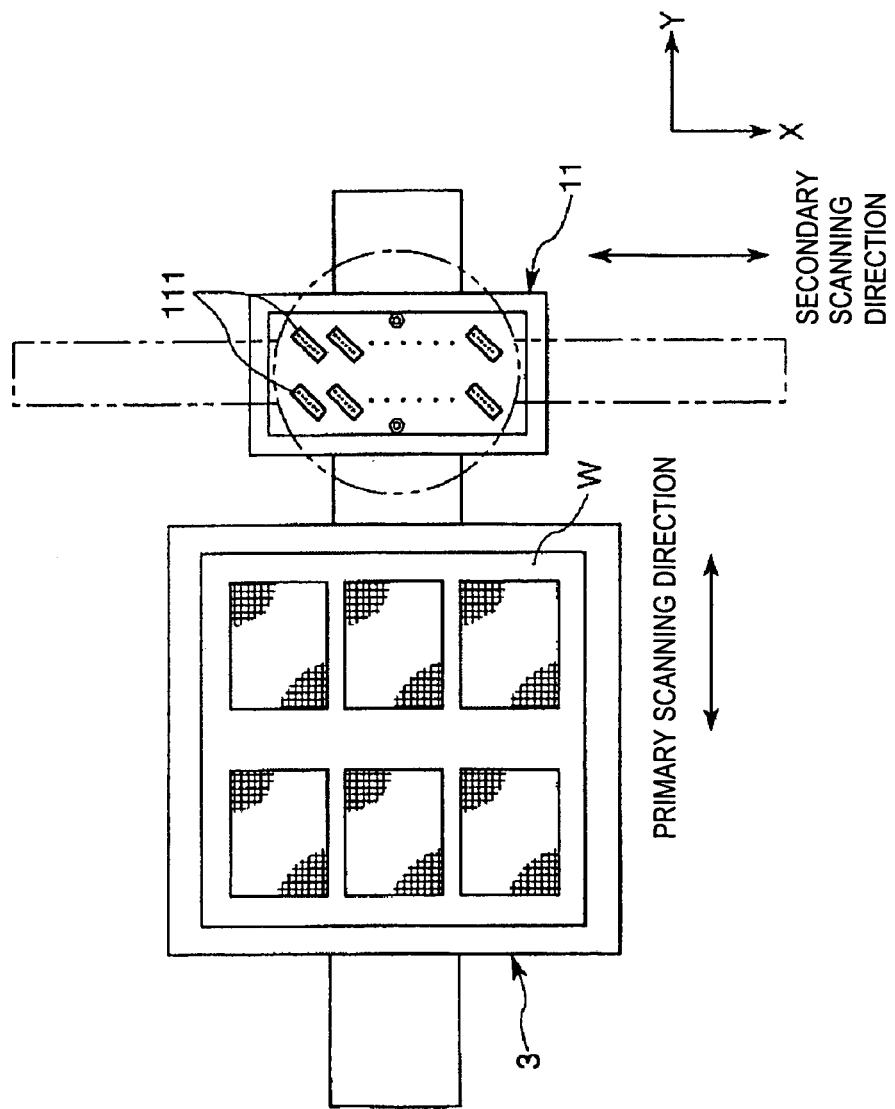
FIG. 8 is a schematic view illustrating a pattern forming operation (an imaging operation) according to a principle of the present invention.

FIG. 8 is a schematic view illustrating a pattern-forming operation (an imaging operation) in the liquid droplet ejecting apparatus shown in FIGS. 1 and 2. As shown in FIG. 8, the head unit 11 is provided with a plurality of droplet ejecting heads 111 (twelve in this embodiment). In the nozzle-formed surface of each droplet ejecting head 111, a plurality of ejecting nozzles (holes) for ejecting the liquid droplets are formed to be arranged in one or more lines. In the head unit 11, the twelve droplet ejecting heads 111 are arranged in the second scanning direction (the X-axis direction) to form two lines in which six droplet ejecting heads are arranged on every line, and the nozzle lines of the droplet ejecting heads 111 are positioned obliquely about the secondary scanning direction.

Each ejecting nozzle of the droplet ejecting heads 111 is provided with a driving part having a piezoelectric element as a driving element (not shown). The control unit 16 controls the driving parts of the droplet ejecting heads 111 via a driver (not shown). Accordingly, in the droplet ejecting heads 111, the liquid droplets are ejected from predetermined ejecting nozzles of predetermined droplet ejecting heads 111. In this case, for example, when a predetermined voltage is applied to a piezoelectric element, the piezoelectric element is deformed (expanded or contracted) to apply pressure to a corresponding pressure room (a liquid room), so that the predetermined amount of liquid droplets is ejected from the corresponding ejecting nozzle (an ejecting nozzle communicating with the above pressure room).

In the present invention, the droplet ejecting heads 111 are not limited to the aforementioned configuration, and may have, for example, a configuration in which the liquid to be heated are heated and boiled by means of a heater as a driving element and then the liquid droplets are ejected from the ejecting nozzle by means of its pressure.

The aforementioned arrangement pattern of the droplet ejecting heads 111 in the head unit 11 is only an example, and the droplet ejecting heads 111 adjacent to each other in each line of heads may be arranged to form an angle of 90° (that is, the adjacent heads form a truncated chevron shape), or the droplet ejecting heads 111 may be arranged such that the heads between the lines of heads form an angle of 90° (that is, the inter-line heads form a truncated chevron shape). At any rate, the dots of the overall ejecting nozzles of the plural droplet ejecting heads 111 should be continuous in the secondary scanning direction.

Further, the droplet ejecting heads 111 may not be positioned obliquely about the secondary scanning direction, but, instead, the plurality of droplet ejecting heads 111 may be arranged in a zigzag shape, a step shape, etc. Furthermore, as long as a nozzle line (a dot line) having a predetermined length can be formed, the arrangement may have a single droplet ejecting head 111. Furthermore, the main carriage 61 may be provided with a plurality of head units 11.

Next, the entire operation of the liquid droplet ejecting apparatus 1 controlled by the control unit 16 will be briefly described. When the substrate W is supplied onto the substrate-carrying table 3 and is positioned (pre-alignment) at a predetermined position on the substrate-carrying table 3 by means of a substrate positioning unit (not described) provided in the liquid droplet ejecting apparatus 1, the substrate W is suctioned and fixed to the substrate-carrying table 3 via air suction from the suction holes 332 of the substrate-carrying table 3. Next, the recognition camera 107 is moved over the alignment marks formed at a predetermined position (one or more positions) of the substrate W by means of movement of the substrate-carrying table 3 and the camera carriage 106, and then recognizes the alignment marks. On the basis of a recognition result, the θ axial rotation mechanism 105 is actuated to correct a θ axial rotation angle of the substrate W, and correction of positions of the substrate W in the X-axis direction and the Y-axis direction is performed (main alignment) on the data.

After the alignment process on the substrate W is completed, the liquid droplet ejecting apparatus 1 starts the process of forming (imaging) a predetermined pattern on the substrate W. This process is carried out by performing the primary scanning and secondary scanning of the droplet ejecting heads 111 (the head unit 11) on the substrate W.

In the liquid droplet ejecting apparatus 1 according to this embodiment, the primary scanning is performed by ejecting the liquid droplets from the droplet ejecting heads 111 onto the substrate W while moving the substrate W in the Y-axis direction by means of the movement of the substrate-carrying table 3, in a state where the head unit 11 is fixed (not moved relatively) to the main body 2. That is, the Y-axis direction is the primary scanning direction in this embodiment.

Primary scanning may be performed during advance (forward movement) of the substrate-carrying table 3, during retreat (backward movement) of the substrate-carrying table, and during both of advance and retreat (reciprocating movement) of the substrate-carrying table. Further, primary scanning may be performed several times by reciprocating the substrate-carrying table 3 several times. Through the primary scanning, the ejection of liquid droplets onto an area of the substrate W extending in the primary scanning direction with a predetermined width (a width which can be covered with the head unit 11) is completed.

After the primary scanning, secondary scanning is performed. While liquid droplets are not being ejected, secondary scanning is performed by moving the head unit 11 by a predetermined width in the X-axis direction through movement of the main carriage 61. That is, in this embodiment, the X-axis direction is the secondary scanning direction.

After secondary scanning, primary scanning, described above, is performed again. Accordingly, the liquid droplets are ejected to an area adjacent to the area in which the liquid droplets are ejected through previous primary scanning.

In this way, by repeatedly and alternately performing the primary scanning and the secondary scanning, the liquid droplets are ejected to the entire area of the substrate W, so that it is possible to form (image) a predetermined pattern of the ejected liquid droplets (liquid) on the substrate W.

In the present invention, the primary scanning direction and the secondary scanning direction may be inverted. That is, primary scanning may be performed by ejecting the liquid droplets to the substrate W while moving the droplet ejecting head 111 (head unit 11) in the X-axis direction in a state where the substrate W (the substrate-carrying table 3) is fixed, and secondary scanning may be performed by moving the substrate W (the substrate-carrying table 3) in the Y-axis direction during non-ejection of the liquid droplets.

Figure 10:
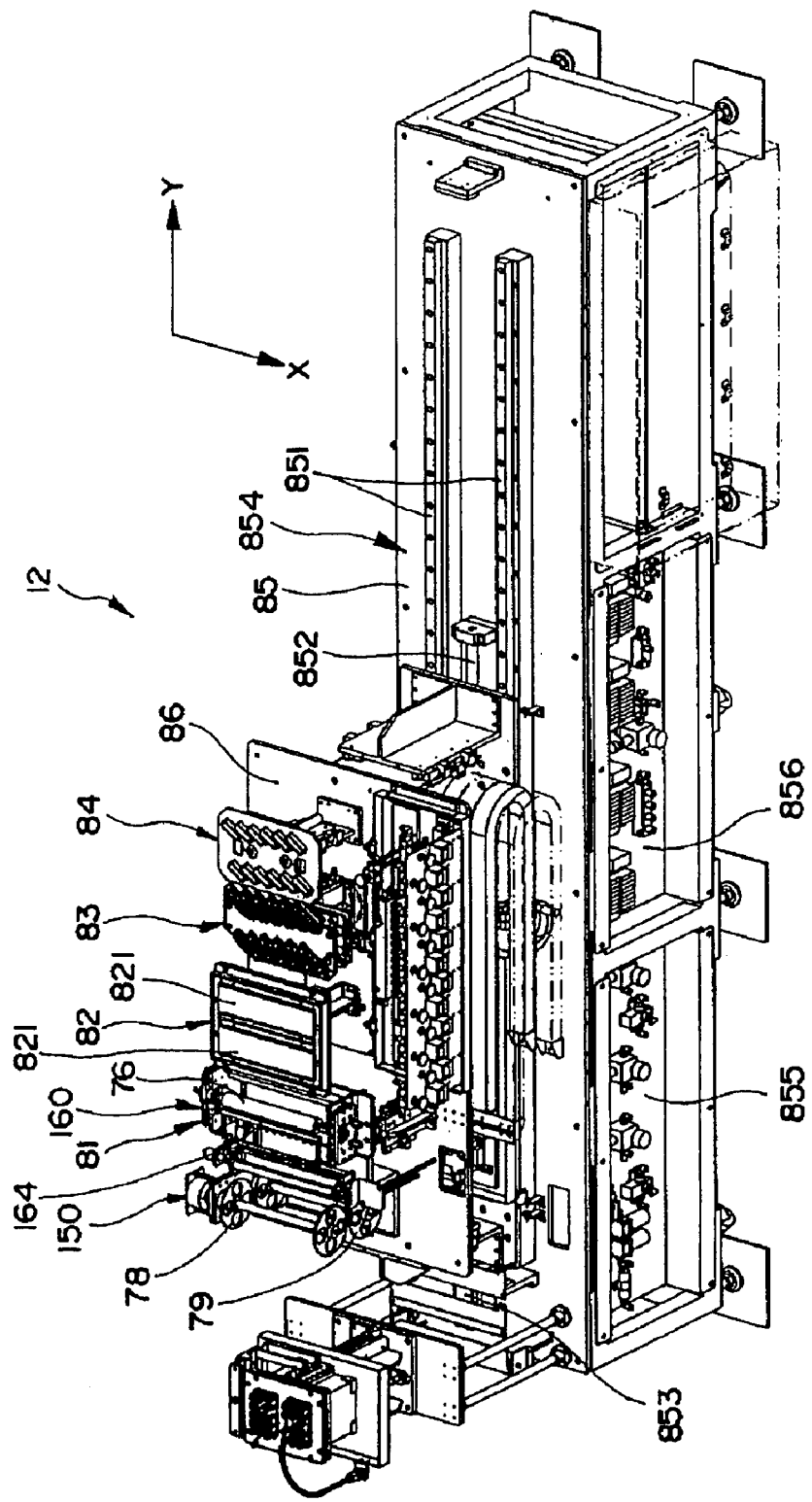
FIG. 10 is a perspective view illustrating an accessory apparatus in the liquid droplet ejecting apparatus according to a principle of the present invention.
Figure 11:
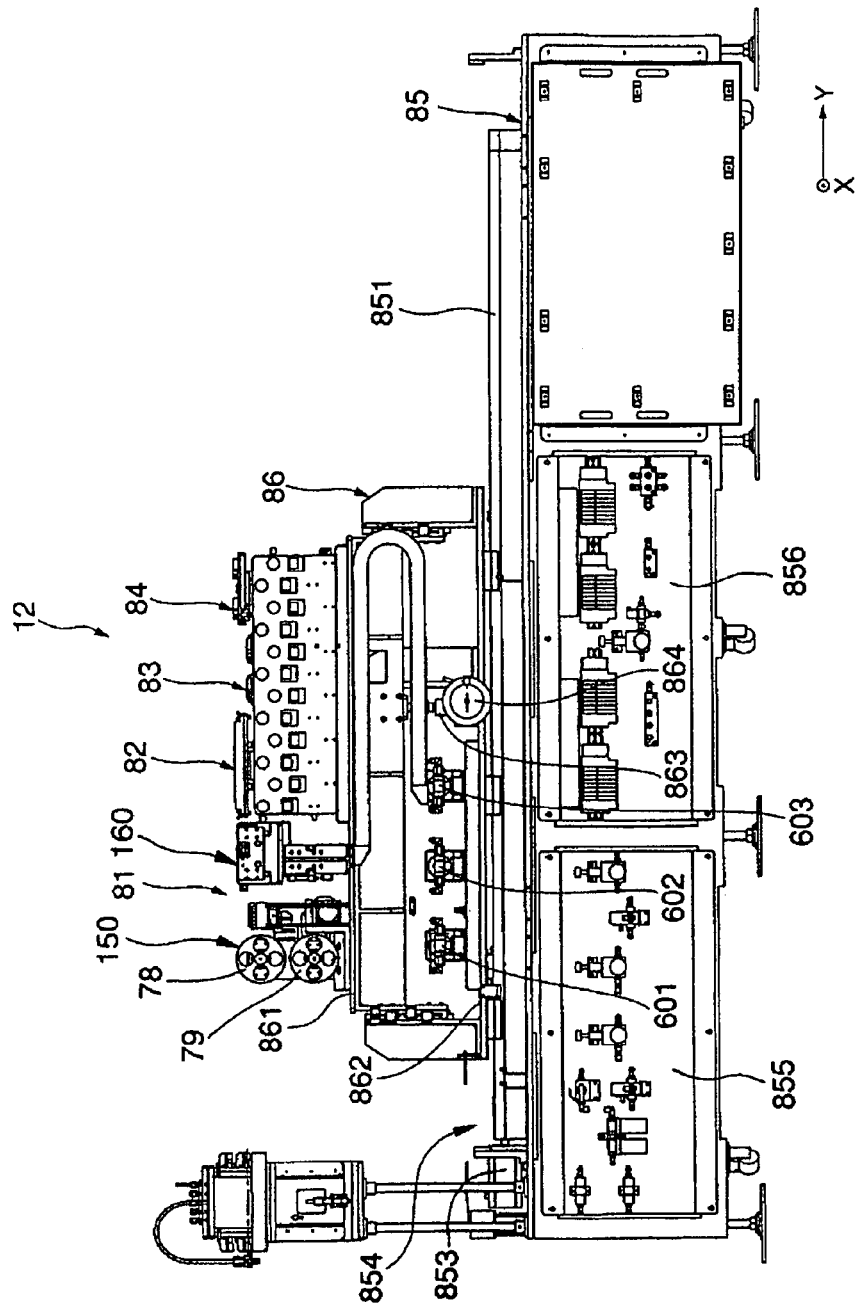
FIG. 11 is a side view illustrating the accessory apparatus of the liquid droplet ejecting apparatus according to a principle of the present invention.
Figure 19:
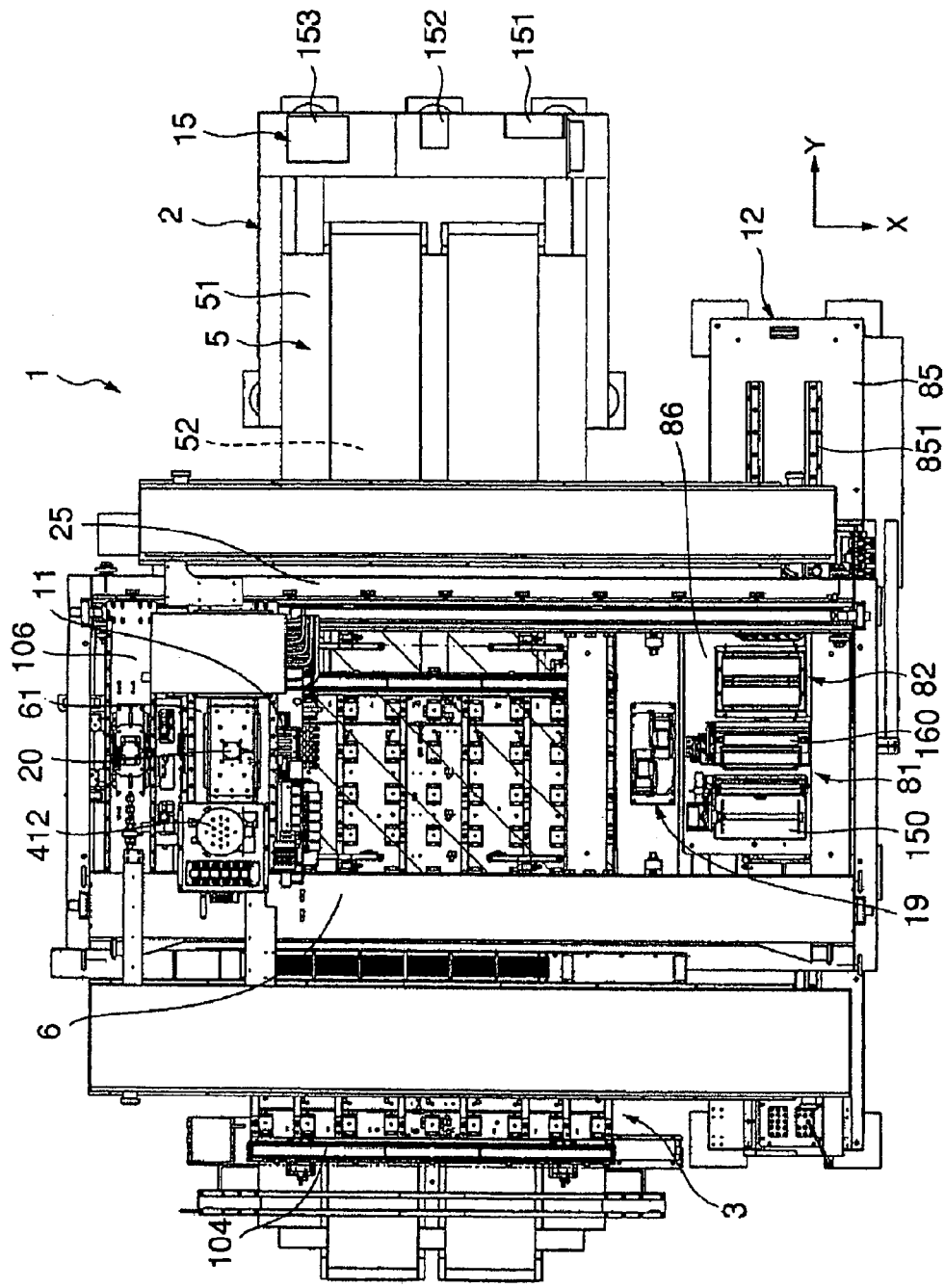
FIG. 19 is a plan view of the liquid droplet ejecting apparatus shown in FIGS. 1 and 2.
Figure 20:
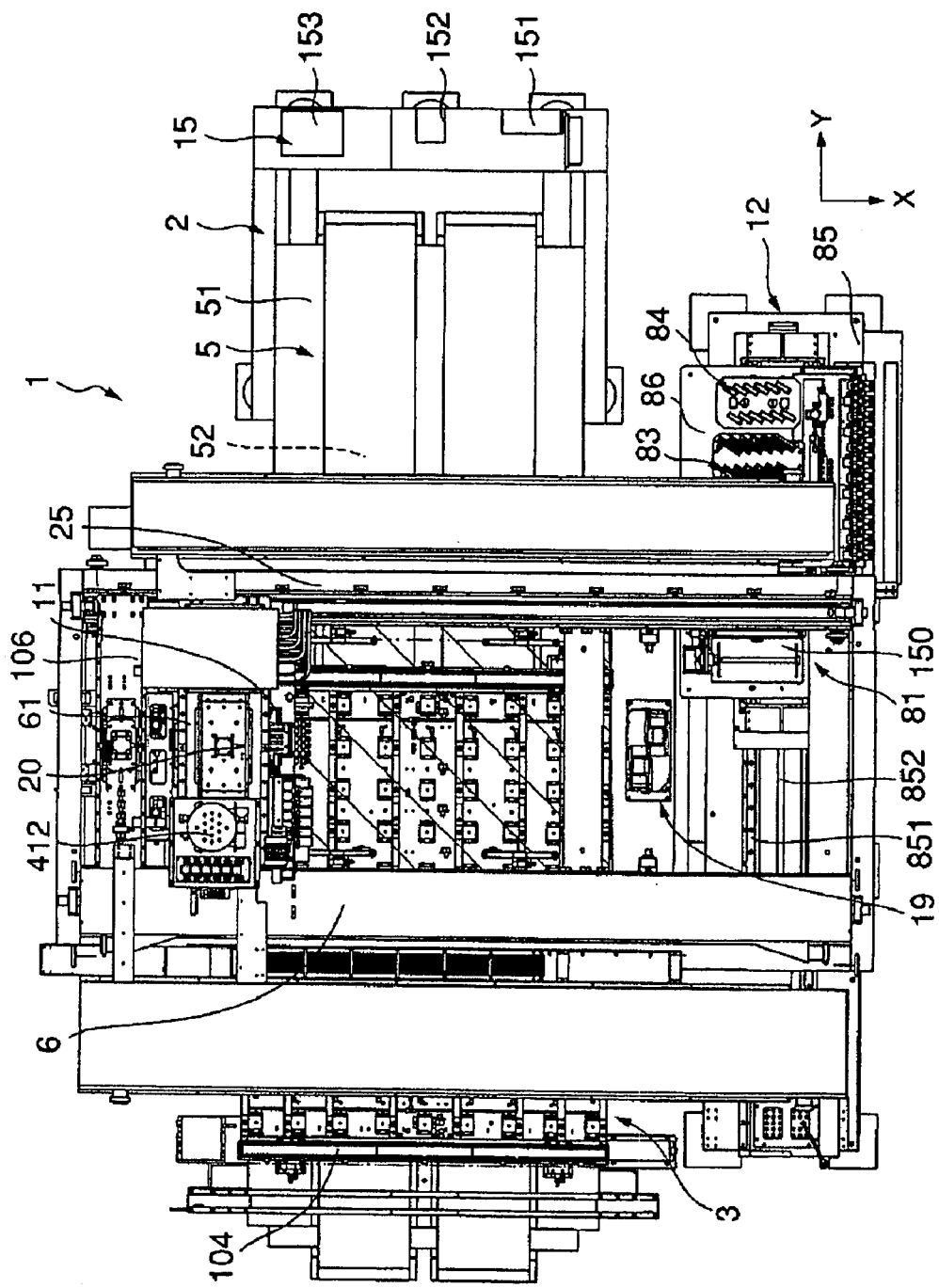
FIG. 20 is a plan view of the liquid droplet ejecting apparatus shown in FIGS. 1 and 2.

FIGS. 10 and 11 are a perspective view and a side view illustrating the accessory apparatus of the liquid droplet ejecting apparatus shown in FIGS. 1 and 2, respectively; and FIGS. 19 and 20 are plan views illustrating the liquid droplet ejecting apparatus shown in FIGS. 1 and 2. Now, with reference to these figures, the accessory apparatus 12 of the liquid droplet ejecting apparatus 1 will be described.

The head unit 11 waits at a position above the accessory apparatus 12, for example, during the supply and removal of the substrate W. In the course of the wait, the cleaning process or the capping process on the nozzle-formed surfaces of the droplet ejecting heads 111 is performed, or the regular wastefully ejection process (the regular flushing process) is performed.

The accessory apparatus 12 is provided at a side portion (the front side in the X-axis direction with respect to the main body 2) of the trestle 21 and the stone surface plate 22 of the main body 2. As shown in FIG. 10, the accessory apparatus 12 has an accessory stand 85 provided on the floor, a movable platen 86 which can be moved in the Y-axis direction on the accessory stand 85, a cleaning unit (a cleaner for the droplet ejecting heads) 81, a regular flushing unit 82, a capping unit 83, and an ejection-amount measuring unit (a weight measuring unit) 84.

The cleaning unit 81, the regular flushing unit 82, the capping unit 83, and the ejection-amount measuring unit 84 (hereinafter referred to as 'four kinds of droplet ejecting head maintenance units') are one of the droplet ejecting head maintenance units used for function maintenance, function recovery, adjustment and inspection of the droplet ejecting heads 111, respectively. In the liquid droplet ejecting apparatus 1 according to the present invention, the four kinds of droplet ejecting head maintenance units are arranged in a group on the movable platen 86 as a maintenance-unit installing section (a maintenance-unit installing area).

As a result of this configuration, the liquid droplet ejecting apparatus 1 has high spatial efficiency with respect to the arrangement of the droplet ejecting head maintenance units, and the entire space of the liquid droplet ejecting apparatus 1 can be effectively utilized so that the installation space (the occupied area) required for installing the liquid droplet ejecting apparatus 1 in a plant can be reduced. In addition, since the four kinds of droplet ejecting head maintenance units are arranged in a group close to each other, the relative movement of the droplet ejecting head maintenance units and the head unit 11 can be rapidly performed. Thus, unnecessary movement is minimal when the head unit 11 sequentially uses the droplet ejecting head maintenance units. Therefore, the cycle time required for processing one sheet of the substrates W can be lessened so that it is possible to enhance throughput (the production efficiency). The respective droplet ejecting head maintenance units will be described later.

The accessory stand 85 of the accessory apparatus 12 has a longitudinal shape in the Y-axis direction, and the upper portion (the top surface) thereof is provided with a maintenance-unit moving mechanism 854. The maintenance-unit moving mechanism 854 has a pair of guides (rails) 851 for guiding the movable platen 86 in the Y-axis direction, a ball screw 852, and a motor 853 for rotating the ball screw 852, so that the movable platen 86 can be moved (advanced or retreated) in the Y-axis direction.

As shown in FIG. 11, the movable platen 86 has a top end 861, a bottom end 862, a hoisting mechanism (a height adjusting mechanism) 863 using a ball screw, and a hoisting handle 864. The top end 861 can go up and down with respect to the bottom end 862 by means of the hoisting mechanism 863, and the height of the top end 861 can be adjusted by driving the hoisting handle 864 to operate the hoisting mechanism 863. The hoisting mechanism 863 is not limited to the manual operation, and may be operated automatically by providing a driving source such as a motor.

On the top end 861 of the movable platen 86, the cleaning unit 81, the regular flushing unit 82, the capping unit 83, and the ejection-amount measuring unit 84 are arranged in a line along the Y-axis direction. Therefore, when the head unit 11 is placed above the accessory apparatus 12 by moving the movable platen 86 in the Y-axis direction, one of the four kinds of droplet ejecting head maintenance units can be selectively placed below the head unit 11, and maintenance by the selected droplet ejecting head maintenance unit can be performed on the head unit.

For example, in a state where the movable platen 86 is placed at a position shown in FIG. 1, since the capping unit 83 is placed below the droplet ejecting heads 111 of the head unit 11 when the head unit 11 is moved above the accessory apparatus 12, the capping process can be performed. In a state where the movable platen 86 is placed at a position as shown in FIG. 19, since a roller unit 160 (a roller 76) of the cleaning unit 81 is placed below the droplet ejecting heads 111 of the head unit 11 when the head unit 11 is moved above the accessory apparatus 12, the cleaning process can be performed on the nozzle-formed surfaces of the droplet ejecting heads 111. Similarly, the wasteful ejection by the regular flushing unit 82 or ejection of liquid droplets by the ejection-amount measuring unit 84 can be performed.

In this way, in this embodiment, since the four kinds of droplet ejecting head maintenance units can be arranged in a line along the Y-axis direction by providing the maintenance-unit moving mechanism 854, the side space of the main body 2 can be more effectively utilized, so that it is possible to shorten the entire X-axis length of the liquid droplet ejecting apparatus 1.

In this embodiment, the droplet ejecting heads 111 can be replaced by detaching and attaching the droplet ejecting heads 111 from the main carriage 61 for each head unit 11. In replacing the droplet ejecting heads 111 (the head unit 11), as shown in FIG. 20, the maintenance-unit moving mechanism 854 moves the movable platen 86 to the rightmost end in FIG. 20, and then moves the head unit 11 above the accessory apparatus 12. Accordingly, since the droplet ejecting heads 111 (the head unit 11), detached and attached, and the four kinds of droplet ejecting head maintenance units on the movable platen 86 do not interfere with each other, it is possible to replace the droplet ejecting heads 111 (the head unit 11) easily, rapidly and smoothly.

In this embodiment, when the height of the droplet ejecting heads 111 (the head unit 11) is varied correspondingly to the thickness of the substrate W by means of the head unit height adjusting mechanism 20, the height of the respective droplet ejecting head maintenance units provided on the top end 861 can be adjusted by means of the hoisting mechanism 863 in accordance with the height variation, so that it is possible to easily cope with the height variation of the droplet ejecting heads 111 accompanying with the thickness variation of the substrate W to be manufactured. Height adjustment (height fitting) of the droplet ejecting head maintenance units and the droplet ejecting heads 111 may be performed via up and down movements of the head unit 11 by means of the head unit height adjusting mechanism 20.

In this embodiment, the movable platen 86 as the maintenance-unit installing section is supported by the accessory stand 85 that is physically separated from the main body 2. Accordingly, since the vibration generated from the droplet ejecting head maintenance units on the movable platen 86 or the maintenance-unit moving mechanism 854 can be prevented from being transferred to the main body 2, it is possible to avoid an adverse effect on the accuracy of the pattern to be formed (imaged) on the substrate W.

Further, since the size of the stone surface plate 22 can be greatly reduced, as compared with a case in which the four droplet ejecting head maintenance units (the movable platen 86) are provided on the stone surface plate 22, it is possible to reduce the cost for the expensive stone surface plate 22 and to reduce the entire weight of the liquid droplet ejecting apparatus 1. Furthermore, since positional accuracy required for the four droplet ejecting head maintenance units provided on the movable platen 86 is relatively low, accuracy problems are avoided even if the droplet ejecting head maintenance units are not provided on the stone surface plate 22.

Now, the four droplet ejecting head maintenance units provided in a group on the top end 861 of the movable platen 86 will be sequentially described.

Figure 14:
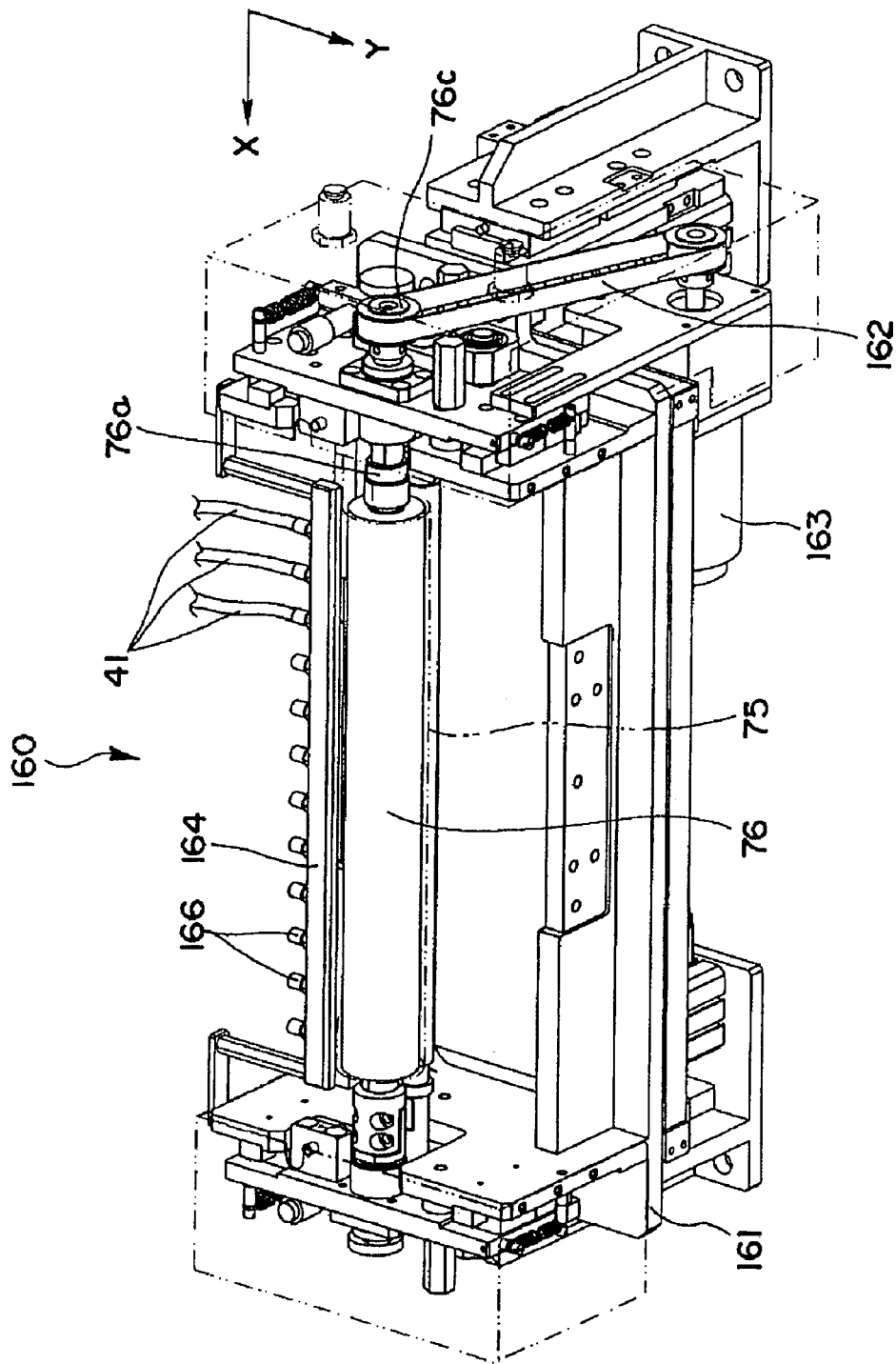
FIG. 14 is a perspective view illustrating a roller unit in the cleaning unit according to a principle of the present invention.

FIG. 14 is a perspective view illustrating the roller unit of the cleaning unit of the accessory apparatus shown in FIGS. 10 and 11.

The cleaning unit 81 wipes and cleans, regularly or occasionally, the respective nozzle-formed surfaces of the droplet ejecting heads 111 with a wiping sheet 75.

The wiping sheet 75 has a feature that enable it to suction liquid. Further, its material is not particularly limited, and for example, woven cloth made of polyester can be suitably used.

As shown in FIGS. 10 and 11, the cleaning unit 81 has a wiping sheet supply unit 150 and a roller unit 160. The wiping sheet supply unit 150 comprises a wind-off roller 78 for winding off and supplying the wiping sheet 75, a take-up roller 79 for taking up the wiping sheet 75 after wiping the nozzle-formed surfaces, and an electric motor for rotating the take-up roller 79.

As shown in FIG. 14, the roller unit 160 has a cylindrical roller 76 for pressing the wiping sheet 75 wound off from the wind-off roller 78 on the nozzle-formed surfaces. The roller 76 is rotatably supported by a roller casing 161. At least the outer circumferential portion of the roller 76 is preferably made of an elastic material, such as rubber, etc., and thus has repulsive elasticity against the pressing force on the outer circumferential surface (pressing surface). The roller 76 is rotated in synchronism with the supply speed of the wiping sheet 75 supplied from the wiping sheet supply unit 150. Here, the rotation of the roller 76 is performed by means of an electric motor 163 via a pulley 76c coaxially attached to the end portion of the rotary axis 76a of the roller 76 and a belt 162.

According to this cleaning unit 81, a new cleaning surface of the wiping sheet 75 can be endlessly supplied to the nozzle-formed surfaces of the droplet ejecting heads 111. Further, since the wiping sheet 75 is pressed on the nozzle-formed surfaces by means of the pressing force of the roller 76, it is possible to ensure that the cleaning surface is brought into contact with the nozzle-formed surfaces.

In the vicinity of the roller 76, a nozzle unit 164 having a plurality of nozzles (twelve nozzles in the shown configuration) for spraying the cleaning solution onto the wiping sheet 75 before wiping the nozzle-formed surfaces is provided. The nozzle unit 164 is a rod-shaped member in which a plurality of nozzles are perforated downwardly, and is provided parallel to an axial line (a rotary axis) of the roller 76. The wiping sheet 75 wound off from the wind-off roller 78 passes under the nozzle unit 164, under the guidance of the guide roller, not shown, to reach the roller 76. The nozzle unit 164 sprays the cleaning solution onto the wiping sheet 75 passing under the nozzle unit through the nozzles from the surface side (the top surface). According to this configuration, the wiping sheet 75 before wiping the nozzle-formed surfaces can suction the cleaning solution, so that the wiping sheet 75 can be wet.

The cleaning solution is not particularly limited, and may include, for example, various cleaning agents or organic solvents. Unlike the shown configuration, the nozzle unit 164 may spray the cleaning solution from the back surface (the bottom surface) side of the wiping sheet 75.

The respective nozzles formed in the nozzle unit 164 do not communicate with each other, but are independent from each other. The nozzle unit 164 is provided with piping connectors 166 corresponding to the respective nozzles, and the respective connectors 166 are connected to branching tubules 41 for supplying the cleaning solution to the corresponding nozzles. The branching tubules 41 are formed out of flexible tubes. The respective nozzles are supplied with a cleaning solution through the respective branching tubules 41 by means of a cleaning solution supply unit 50 that will be described later. In FIG. 14, for the purpose of simplification, only three of the twelve branching tubules 41 are shown.

Since the ejection liquid attached to the nozzle-formed surfaces of the droplet ejecting heads 111 can be wiped out regularly or occasionally by means of the cleaning unit 81, disturbance is prevented from occurring in the ejecting direction (the flying direction) of the liquid droplets from the droplet ejecting nozzles, and thus the liquid droplets can be straightly sprayed, so that it is possible to form (image) a pattern with high accuracy on the substrate W.

In the cleaning unit 81, the outer circumferential portion of the roller 76 may be divided plurally in the rotation axial direction of the roller 76, and the outer circumferential surfaces (the pressing surfaces) of the divided portions may press the wiping sheet 75 against the droplet ejecting heads 111. In this configuration, since the adjacent pressing surfaces do not interfere with each other in a state where the wiping sheet 75 is pressed against the nozzle-formed surfaces of the droplet ejecting heads 111, it is possible to more accurately ensure that the wiping sheet 75 presses against the overall droplet ejecting heads 111.

As shown in FIG. 10, the regular flushing unit 82 has liquid receivers 821 for receiving the liquid droplets wastefully ejected from the droplet ejecting heads 111. The head unit 11 wastefully ejects the liquid droplets from the droplet ejecting heads 111 to the liquid receivers 821 regularly or occasionally during the waiting time. This operation is performed for the following purposes.

In general, if a large period of time elapses from the pause of the ejection of the liquid droplets to the restart of ejection of the liquid droplets by the droplet ejecting heads 111, the ejecting direction of the liquid droplets is disturbed, possibly resulting in an amount of ejection that is either too large or too small, and thereby risking the possibility of an unstable droplet ejecting operation. That is, since the ejecting condition is not stable immediately after the droplet ejecting heads 111 begin the ejecting process, it is difficult for the liquid droplets to eject properly, and the amount of ejection is therefore not stable. For this reason, by performing the wasteful ejection to the liquid receivers 821 during the waiting time, a state in which the droplet ejecting head 111 can properly eject the liquid droplets is maintained.

The liquid receivers 821 are preferably provided with liquid absorbers formed of, for example, a sponge. Liquid droplets ejected wastefully to the liquid receivers 821 are first absorbed by the liquid absorber. Accordingly, it is possible to more accurately ensure that wastefully ejected liquid droplets do not fly in all directions. The liquid receivers 821 are connected to suction tubes (not shown), and ejection liquid gathered in the liquid receivers 821 is recovered through the suction tubes, and recovered and stored by means of the liquid discharging unit 18 that will be described later.

Figure 15:
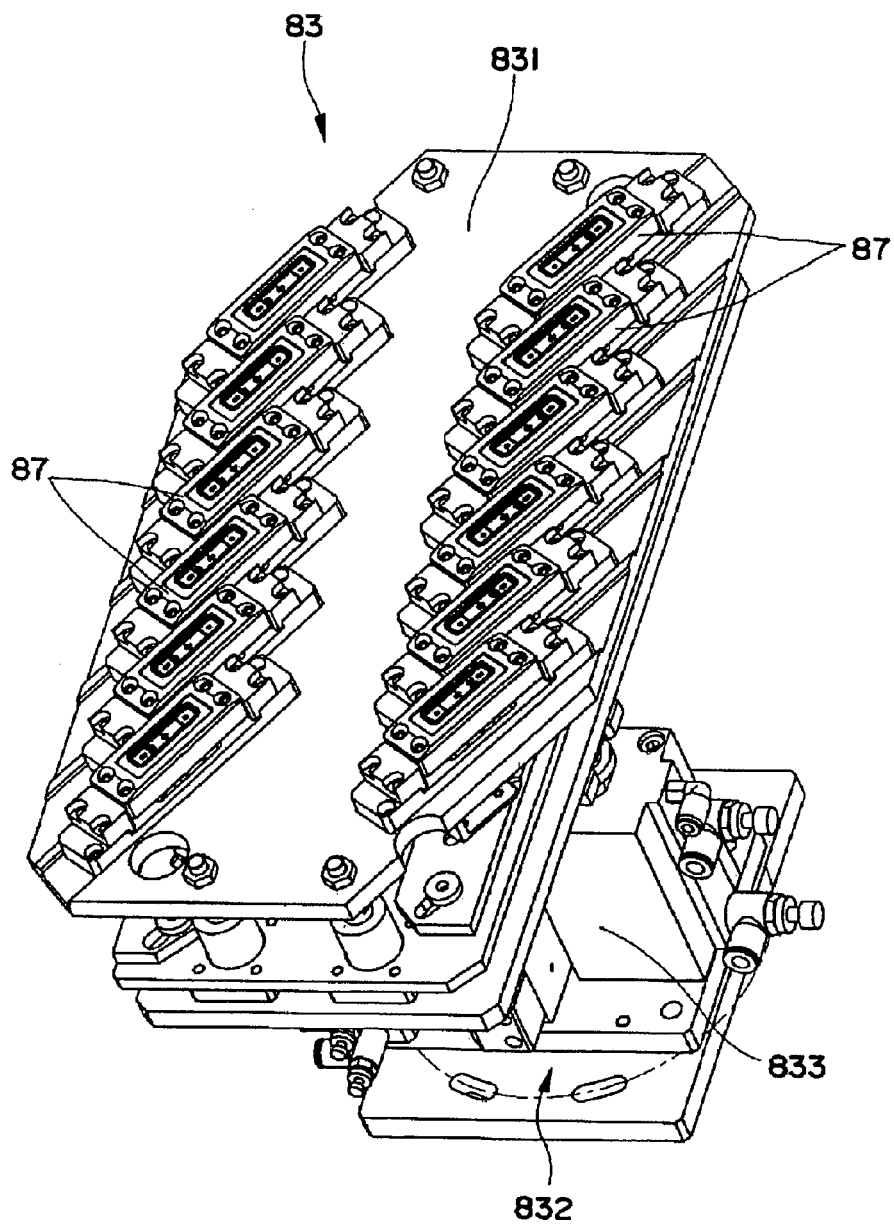
FIG. 15 is a perspective view illustrating a capping unit according to a principle of the present invention.
Figure 16:
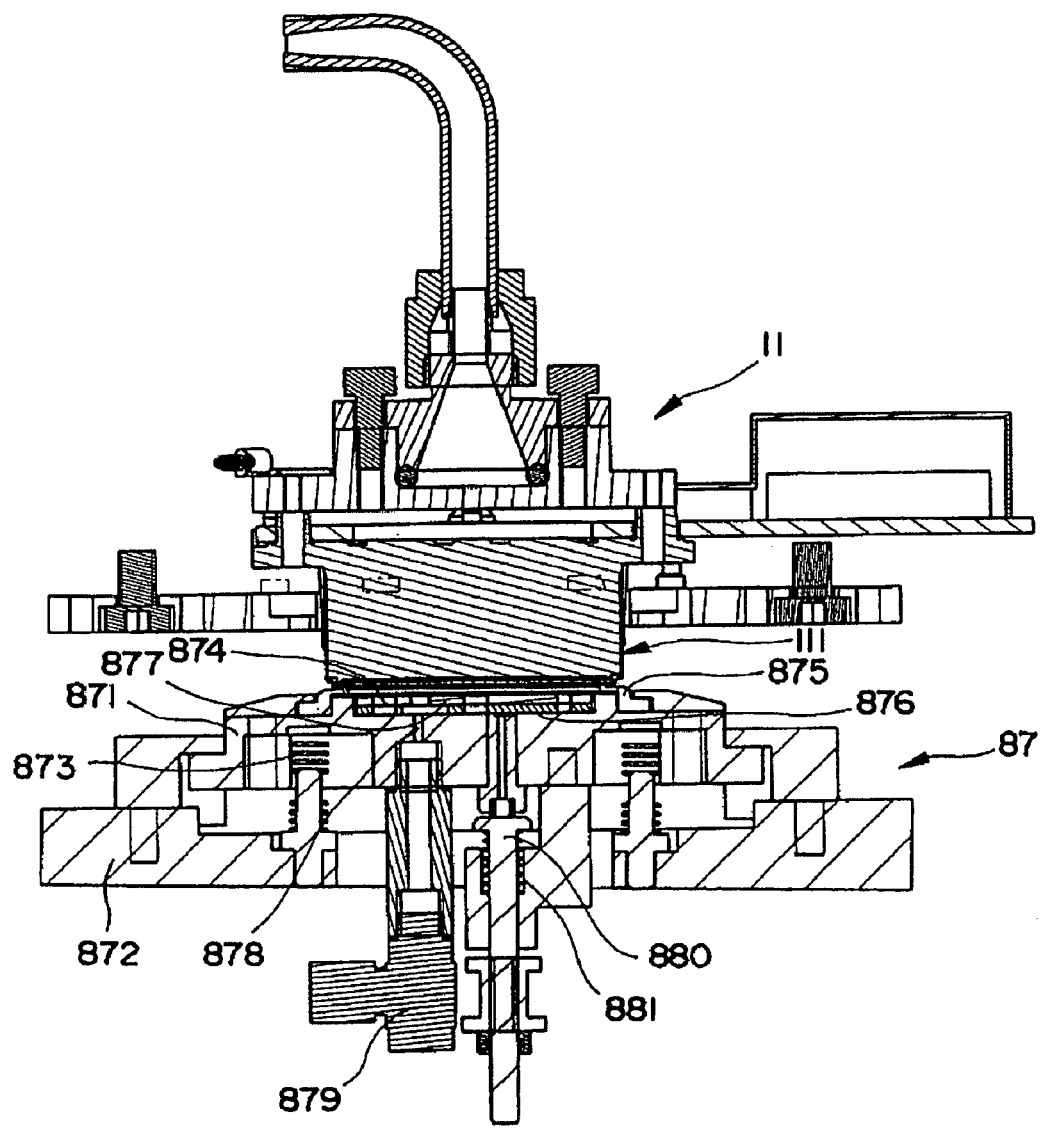
FIG. 16 is a cross-sectional view illustrating a state where a cap is in contact with a droplet ejecting head according to a principle of the present invention.
Figure 17:
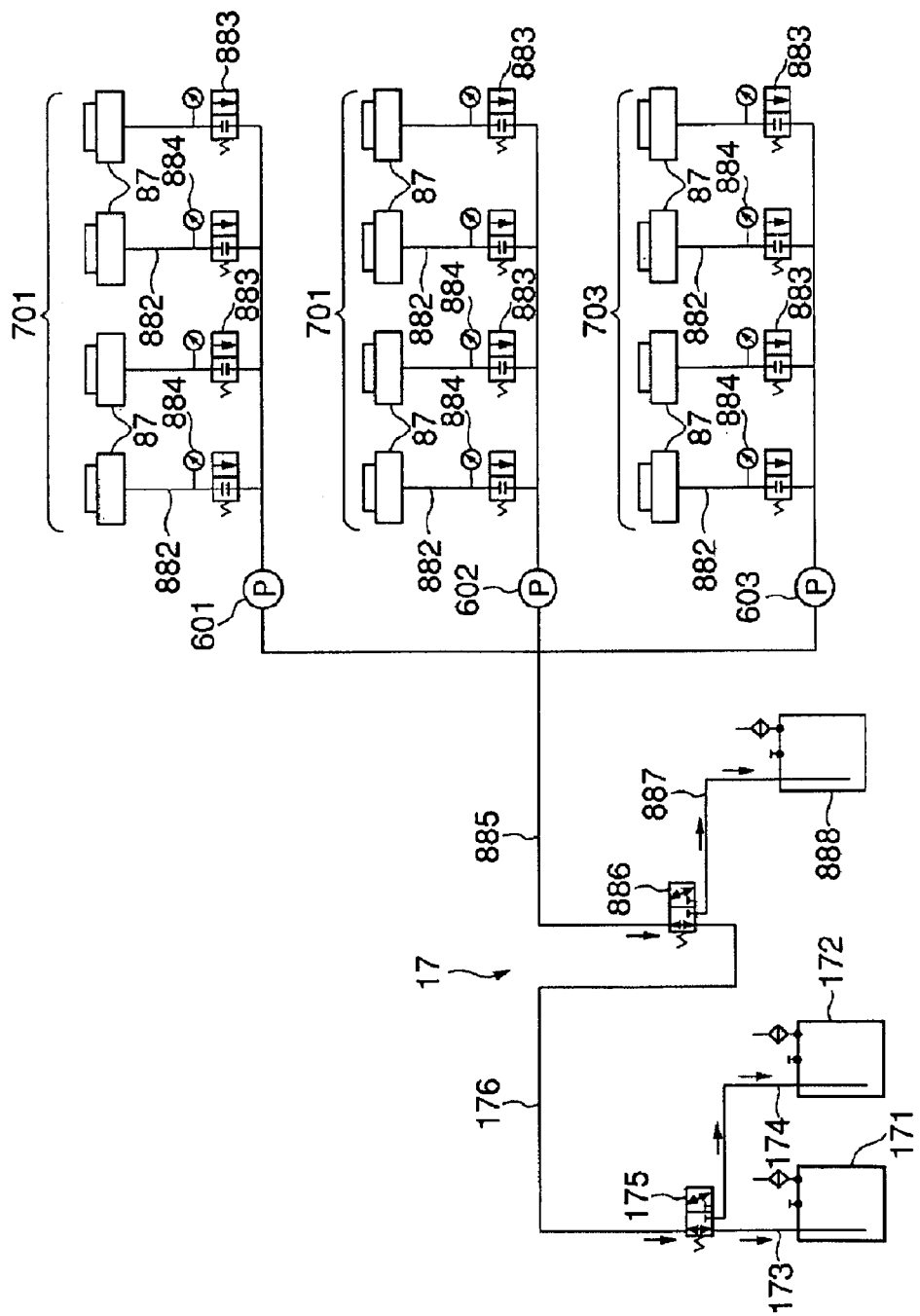
FIG. 17 is an absorption piping system diagram including respective caps in the capping unit according to a principle of the present invention.

FIG. 15 is a perspective view illustrating the capping unit of the accessory apparatus shown in FIGS. 10 and 11, FIG. 16 is a cross-sectional view illustrating a state in which caps come into contact with the droplet ejecting heads, and FIG. 17 is an absorption piping system diagram including respective caps in the capping unit.

Now, the capping unit 83 and the absorption piping system thereof will be described with reference to the above figures.

As shown in FIG. 15, the capping unit 83 has a base plate 831 and twelve caps 87 arranged on the base plate 831. The respective twelve caps 87 correspond to the twelve droplet ejecting heads 111 mounted on the head unit 11, and are arranged in the same arrangement pattern as are the droplet ejecting heads 111. Accordingly, the respective caps 87 can come into (close) contact with and cover the nozzle-formed surfaces of the corresponding droplet ejecting heads 111.

The capping unit 83 has a supporting portion 832 fixed on the movable platen 86, and the base plate 831 is supported by the supporting portion 832.

The supporting portion 832 is provided with a hoisting mechanism 833 employing a pneumatic cylinder for allowing the base plate 831 to go up and down. The caps 87 can go up and down in a group by means of the hoisting mechanism 833.

When the respective droplet ejecting heads 111 of the head unit 11 are capped with the respective caps 87, the respective caps 87 are first allowed to be in a down state, and if the head unit 11 is placed above the capping unit 83, the respective caps 87 are allowed to go up and are brought into (close) contact with the respective droplet ejecting heads 111. In this state, by activating suction pumps 601, 602, and 603 that will be described later, a fluid (gas and liquid) can be suctioned and discharged from the ejecting nozzles of the droplet ejecting heads 111.

The process of bringing the caps 87 into contact with the droplet ejecting heads 111 and suctioning the fluid therefrom (hereinafter, referred to as the 'capping and suctioning operation') is performed regularly or occasionally for the following purposes:

(1) to prevent the nozzle-formed surfaces of the droplet ejecting heads 111 from drying out when the head unit 11 is in a wait state (during the supply or removal of the substrate W);

(2) to prevent the clogging of the nozzles of the droplet ejecting heads 111 in order to recover an ejection ready state;

(3) to fill the droplet ejecting heads 111 and flow paths with the ejection liquid during an initial filling of the ejection liquid;

(4) to discharge the ejection liquid from the droplet ejecting heads 111 and the flow paths during replacement of the ejection liquid with a different kind of liquid; and (5) to allow the cleaning solution to flow in the droplet ejecting heads 111 and the flow paths during a state in which the cleaning solution has been supplied to the droplet ejecting heads 111, when cleaning the droplet ejecting heads 111 and the flow paths before replacement of the ejection liquid.

As shown in FIG. 16, each cap 87 has a cap body 871 and a cap holder 872, and the cap body 871 is biased upwardly by means of two coil springs 873, and is held by the cap holder 872 to be movable up and down in a predetermined range. A concave portion 874 capable of containing a nozzle group formed in one of the droplet ejecting heads 111 is formed on the top surface of the cap body 871, and the edge portion of the concave portion 874 is provided with a seal packing (a seal member) 875 capable of coming in close contact with the droplet ejecting head 111.

The bottom of the concave portion 874 is provided with a liquid absorber 876 formed of, for example, a sponge capable of absorbing liquid during the state in which the liquid absorber is pressed downward by a frame-shaped pressing member 877. Further, an outlet 878 for discharging the fluid suctioned from the droplet ejecting head 111 is formed in the bottom of the concave portion 874, and the outlet 878 communicates with an L-shaped joint 879. The L-shaped joint 879 is connected to a pipe (a tube), not shown, constituting a suction flow path 882 that will be described later.

The respective caps 87 are provided with an opening valve 880, and the opening valve can be opened from the bottom side of the concave portion 874 to the outside. The opening valve 880 is biased into a closed state by means of a coil spring 881, and at the final step of the capping and suctioning operation, the liquid contained in the liquid absorber 876 can be suctioned by opening the opening valve 880.

As shown in FIG. 11, the bottom end 862 of the movable platen 86 is provided with three suction pumps (suctioning force generating source) 601, 602, and 603 as suctioning force generating means for generating a suctioning force (negative pressure) in the respective caps 87 (on the insides of the caps 87). In this embodiment, although the suction pumps 601, 602, and 603 comprise piston pumps, respectively, another type of pump or ejector (vacuum ejectors), etc., may be used as the suctioning force generating source.

The twelve caps 87 of the capping unit 83 are classified into three groups, each of which includes four caps. That is, the four caps 87 placed at the upper position in FIG. 15 constitute a first group 701, the four caps 87 placed at the vertically middle position in FIG. 15 constitute a second group 702, and the four caps 87 placed at the lower position in FIG. 15 constitute the third group 703. As shown in FIG. 17, the suction pumps 601, 602, and 603 correspond to the first group 701, the second group 702, and the third group 703, respectively.

The caps 87 are connected to the suction flow paths 882, respectively, and the suction flow paths 882 converge and are connected to the inlets of the corresponding suction pumps 601, 602, and 603, respectively.

In the middle of the respective suction flow paths 882, switching valves (flow path switching means) 883 capable of cutting off the corresponding flow paths are provided. The switching valves 883 can be automatically switched by means of actuators under the control of the control unit 16.

Furthermore, in the middle of the respective suction flow paths 882, pressure sensors (pressure detecting means) 884 for detecting pressure in the corresponding flow paths are provided. Detection results of the pressure sensors 884 are input into the control unit 16, and on the basis of the detection results, suction errors, etc., in the respective caps 87 can be detected and notified, or operation of the suction pumps can be controlled.

In the capping and suctioning operation, in a state in which by switching the respective switching valves 883 of the first group 701, the second group 702, and the third group 703, the suction flow paths 882 from the caps 87, other than one cap 87 selected from the groups, are cut off, the suction from the selected one cap 87 is performed. While switching the switching valves 883, the sequential suction from the four caps 87 of each group is performed.

The pipes connected to the respective discharging outlets of suction pumps 601, 602, and 603 are merged to form one discharging flow path 885 that is connected to a three-way valve (flow path switching means) 886. The downstream side of the three-way valve 886 is divided into a discharging flow path 176 and a discharging flow path 887; the discharging flow path 176 is connected to a three-way valve (flow path switching means) 175, and the discharging flow path 887 is connected to a waste liquid tank (a waste liquid storage unit) 888. The three-way valve 886 and the three-way valve 175 are automatically switched by means of actuators under the control of the control unit 16.

As described above, when the droplet ejecting heads 111 and the flow paths are cleaned, a cleaning solution is supplied to the droplet ejecting heads 111 of the head unit 11 from a cleaning solution supply means, not shown, to perform the capping and suctioning operation (the aforementioned (5)). At this time, the three-way valve 886 is switched to a state in which a flow is formed from the discharging flow path 885 to the discharging flow path 887, and the cleaning solution discharged from the droplet ejecting heads 111 is introduced into and stored in the waste liquid tank 888.

On the contrary, in the capping and suctioning operation (the aforementioned (1) through (4)) in a normal state in which ejection liquid is supplied to the droplet ejecting heads 111 of the head unit 11, the three-way valve 886 is switched to a state in which a flow is formed from the discharging flow path 885 to the discharging flow path 176, and the ejection liquid discharged from the respective droplet ejecting heads 111 flows toward the three-way valve 175.

The downstream side of the three-way valve 175 is divided into an introducing flow path 173 and an introducing flow path 174; the introducing flow path 173 is connected to a first reuse tank 171, and the introducing flow path 174 is connected to a second reuse tank 172. The first reuse tank 171 and the second reuse tank 172 are provided in the tank housing unit 13 as described above.

The ejection liquid flowing from the discharging flow path 176 is introduced into and stored in the first reuse tank 171 and the second reuse tank 172 by means of switching of the three-way valve 175.

In this embodiment, the first reuse tank 171, the second reuse tank 172, the introducing flow path 173, the introducing flow path 174, the three-way valve 175, the discharging flow path 176, the discharging flow path 885, the three-way valve 886, the discharging flow path 887, and the waste liquid tank 888 described above constitute a liquid recovering unit (liquid recovering means) 17.

In this way, the liquid recovering unit 17 transfers the ejection liquid discharged from the respective droplet ejecting heads 11 in the capping and suctioning operation, and stores the ejection liquid in the first reuse tank 171 and the second reuse tank 172, exclusive, without mixing it with different liquid (for example, the ejection liquid obtained from the before-imaging flushing unit 104, the regular flushing unit 82 and the dot-omission detecting unit 19, or the cleaning solution used for cleaning the droplet ejecting heads 111 and the flow paths).

Since ejection liquid recovered into the first reuse tank 171 and the second reuse tank 172 is not exposed to the outside and is not in contact with the outside atmosphere until the ejection liquid is first discharged from the droplet ejecting heads 111 and is finally transferred to the first reuse tank 171 or the second reuse tank 172, only a minimal amount of foreign materials, such as refuse, etc., if any, are mixed thereto, and a solvent is never vaporized to change the concentration thereof. Further, since different liquids are not mixed thereto as described above, the ejection liquid lies in a good condition without a change in quality due to deterioration or the mixing of foreign materials. Therefore, the ejection liquid recovered into the first reuse tank 171 and the second reuse tank 172 can be supplied again to the first primary tank 401 and the second primary tank 402, and can be reused as ejection liquid to be ejected from the droplet ejecting heads 111. As a result, since the unnecessary amount of consumption of the ejection liquid can be greatly reduced, it is possible to reduce the manufacturing cost for the substrate W.

It is preferable that before reusing the ejection liquid recovered into the first reuse tank 171 and the second reuse tank 172 (before restoring the ejection liquid to the first primary tank 401 and the second primary tank 402), the ejection liquid be subjected to a process of removing impurities therefrom (for example, a filtering process using a filter) or a de-aerating process of removing gas dissolved therein (for example, a process of sparkling the dissolved gas under a reduced pressure condition). As a result, the recovered ejection liquid to be reused will be in better condition.

Since the liquid recovering unit 17 according to this embodiment uses both the first reuse tank 171 and the second reuse tank 172 while switching between them, the entire capacity can be increased, and it is thus possible to effectively cope with an increase in the amount of suction at the time of capping following a growth in size of the liquid droplet ejecting apparatus 1. Since the entire capacity can be increased without excessively increasing individual capacities of the first reuse tank 171 and the second reuse tank 172, excessive weights (specifically, weights when they are full) of the first reuse tank 171 and the second reuse tank 172 can be avoided, so that it is possible to reduce the burden of an operator when replacing the tanks. By alternately replacing (recovering) the first reuse tank 171 and the second reuse tank 172, it is possible to recover ejection liquid without stopping the operation of the liquid droplet ejecting apparatus 1. Therefore, production efficiency (throughput) can be enhanced.

Figure 13:
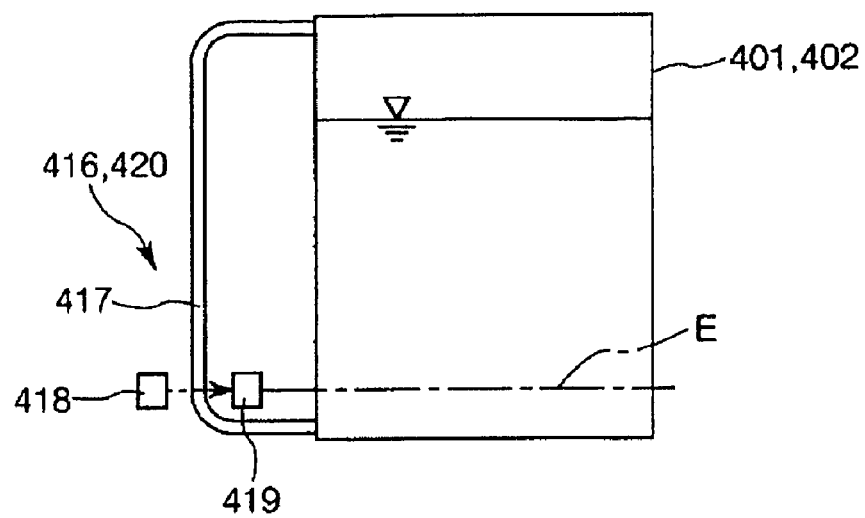
FIG. 13 is a diagram schematically illustrating the configuration of liquid amount detecting means according to a principle of the present invention.
Figure 13:
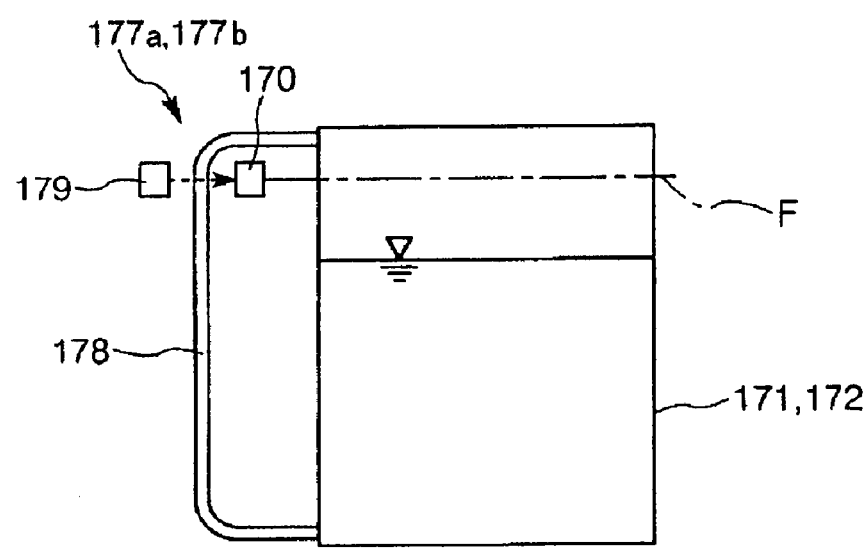

FIG. 13 is a diagram schematically illustrating a configuration of the liquid amount detecting means. As shown in FIG. 13(b), the liquid recovering unit 17 further includes liquid amount detecting means 177a for detecting the amount of liquid in the first reuse tank 171. The liquid amount detecting means 177a includes an optically transparent tube 178, of which the inner cavity communicates with the inside of the first reuse tank 171 and which is provided vertically outside of the first reuse tank 171, and a light-emitting portion 179 and a light-receiving portion 170 facing each other with the tube 178 therebetween in the vicinity of the top of the first reuse tank 171. When the amount of liquid in the first reuse tank 171 is increased by means of the variation of the amount of light received by the light-receiving portion 170 to reach a predetermined upper limit level F (full), the liquid amount detecting means 177a can detect it. The detection result of the liquid amount detecting means 177a is input into the control unit 16. The liquid recovering unit 17 further comprises liquid amount detecting means 177b similar to the liquid amount detecting means 177a, for detecting the amount of liquid in the second reuse tank 172.

In the liquid recovering unit 17, the ejection liquid suctioned from the capping unit 83 is introduced into the first reuse tank 171 in a state as shown in FIG. 17. Then, when the ejection liquid accumulates in the first reuse tank 171 and the liquid amount detecting means 177a detects that the first reuse tank 171 is full, the control unit 16 switches the three-way valve 175 in accordance with the detection result into a state in which the ejection liquid is introduced into the second reuse tank 172.

It is preferable that when the first reuse tank 171 and the second reuse tank-172 are full, the control unit 16 notify the operator to replace the tank (to recover the ejection liquid), for example, similarly to the above description.

Although two reuse tanks are provided in the liquid recovering unit 17 according to this embodiment as described above, the present invention may provide a single reuse tank or three or more reuse tanks.

Figure 18:
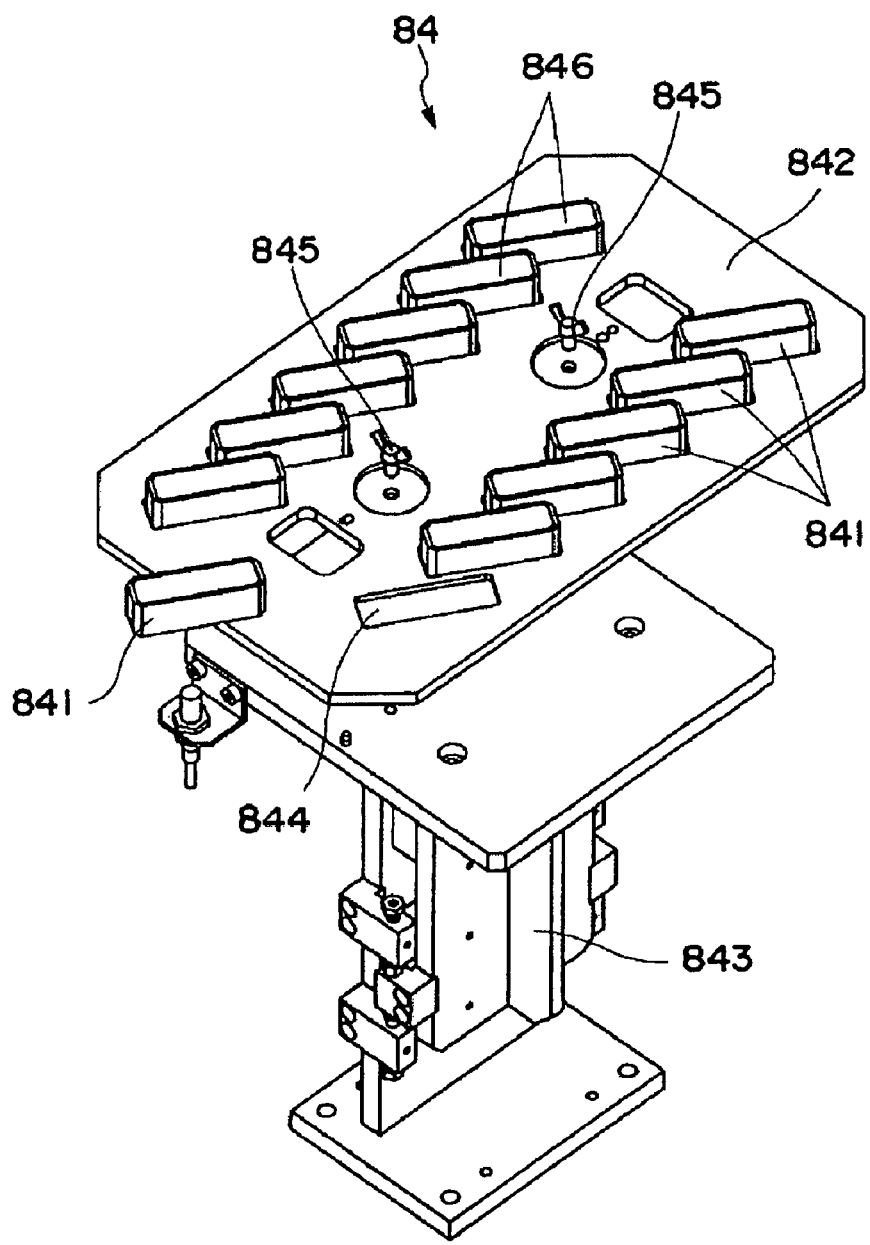
FIG. 18 is a perspective view illustrating an ejection-amount measuring unit according to a principle of the present invention.

FIG. 18 is a perspective view illustrating the ejection-amount measuring unit of the accessory apparatus shown in FIGS. 10 and 11.

The ejection-amount measuring unit 84 is used for measuring the amount of ejection of the liquid droplets (the amount of one droplet) of the droplet ejecting heads 111 as a preliminary step before ejecting the liquid droplets to the substrate W (before forming a pattern). In the liquid droplet ejecting system 10, after the amount of liquid droplets ejected from each droplet ejecting head 111 is measured in advance and the amount of liquid droplets ejected from the respective droplet ejecting heads 111 is adjusted to a proper value (a predetermined value) in accordance with the measuring result, the ejection operation is performed on the substrate W. Accordingly, it is possible to form (image) a pattern with high accuracy.

The timing for performing the measurement and adjustment of the amount of liquid droplets ejected from the droplet ejecting heads 111 is not limited, and may occur when the liquid droplet ejecting system 10 is first activated or when the kind of the ejection liquid is changed. In addition, the measurement and adjustment of the amount of liquid droplets to be ejected may be performed regularly, and may be performed in a substrate unit before the liquid droplets are ejected to the substrate W.

As shown in FIG. 18, the ejection-amount measuring unit 84 comprises a plurality of ejection-amount measuring liquid receivers (ejection-amount measuring tray) 841 (as many as the droplet ejecting heads) corresponding to the respective droplet ejecting heads 111 of the head unit 11, a plate-shaped support 842 for supporting the ejection-amount measuring liquid receivers 841 in a group, and a base 843 fixed to the movable platen 86 to hold the support 842.

The ejection-amount measuring liquid receivers 841 receive the liquid droplets ejected from the droplet ejecting heads-111 and hold (store) the received liquid. The respective ejection-amount measuring liquid receivers 841 are detachable to the support 842. In the top surface of the support 842, concave portions 844 into which the bottoms of the ejection-amount measuring liquid receivers 842 are inserted, respectively, are formed, and thus the ejection-amount measuring liquid receivers 842 can be positioned and supported in the same arrangement as the droplet ejecting heads 111.

The support 842 is fixed to the base 843 by means of two thumbscrews 845 as fixing members to be detachable thereto. Accordingly, since the twelve ejection-amount measuring liquid receivers 841 can be detached and attached in a group for each support 842, it is possible to easily and rapidly perform the detaching and attaching operation.

When measuring the amount of liquid droplets ejected from the droplet ejecting heads 111, the droplet ejecting heads 111 are driven such that the head unit 11 is positioned above the ejection-amount measuring unit 84, and then the liquid droplets are allowed to be ejected from the ejecting nozzles to the corresponding ejection-amount measuring liquid receivers 841. At this time, the number of liquid droplets ejected from each ejecting nozzle is predetermined and is normally about 1 through 100,000, and more preferably about 25,000 through 50,000, but the number is not limited thereto.

In this embodiment, the process of measuring the amount of liquid droplets ejected from a droplet ejecting head 111 is performed by measuring the weight of all of the liquid (overall liquid droplets) received by the corresponding ejection-amount measuring liquid receiver 841.

That is, the weights of the ejection-amount measuring liquid receiver 841 before and after receiving the liquid droplets are measured, and the difference between the two measurements is used as the weight of the overall liquid droplets received by the ejection-amount measuring liquid receiver 841. Then, by dividing the measured weight by the number of liquid droplets received by the ejection-amount measuring liquid receiver 841, the weight of one droplet ejected from each ejection nozzle is obtained.

When measuring the weight of an ejection-amount measuring liquid receiver 841, the twelve ejection-amount measuring liquid receivers 841 are divided by the number of supports 842, and are placed on a weight measuring unit (not shown) provided outside of the liquid droplet ejecting system 10. The weight measuring unit comprises a scale, such as an electronic scale, and preferably automatically measures the weight of each ejection-amount measuring liquid receiver 841. Alternatively, unlike the above construction, a scale may be provided in the ejection-amount measuring unit 84 to measure the weight of each ejection-amount measuring liquid receiver 841 by using the scale.

In this way, when the amount of liquid droplets ejected from the each droplet ejecting head 111 is measured, the amount of liquid droplets to be ejected from each droplet ejecting head 111 is adjusted based on the measured value. The adjustment of the amount of liquid droplets to be ejected from the droplet ejecting heads 111 can be performed by varying at least one of the amplitude, the frequency, or the driving waveform of an applied voltage (the pulse-shaped applied voltage) to the driving elements (piezoelectric elements) provided in the droplet ejecting heads 111. Adjustment is performed by means of manipulation of a manipulation panel (not shown) of the control unit 16.

After the amount of liquid droplets to be ejected from each droplet ejecting head 111 is adjusted, the amount of liquid droplets ejected from each droplet ejecting head 111 may be measured again to check whether the measured value is a proper value. In this way, in the liquid droplet ejecting apparatus 1, by repeatedly performing the measurement and adjustment of the amount of liquid droplets ejected from the droplet ejecting heads 111 as needed, the amount of liquid droplets to be ejected from the droplet ejecting heads 111 is made to be appropriate.

In the liquid droplet ejecting system 10, as described above, the operation of ejecting the liquid droplets onto the substrate W (the operation of forming a pattern) is performed in an atmosphere in which the temperature and humidity, as environmental conditions, are controlled. In general, the amount of liquid droplets ejected from the droplet ejecting heads 111 are varied in accordance with the environmental condition such as temperature, humidity, gaseous composition, gaseous pressure, etc., of the atmosphere, even if the driving conditions of the driving elements are the same. For this reason, even if the amount of liquid droplets ejected from the droplet ejecting heads 111 is measured, when the environmental conditions during the measurement differ from the environmental conditions during the actual ejecting of the liquid droplets onto the substrate W, the measured value generates an error with respect to the amount of liquid droplets ejected in ejecting the liquid droplets onto the substrate W. Therefore, even if the amount of liquid droplets to be ejected is made to be appropriate based on the measured value, improvement of the accuracy is limited.

In consideration of this problem, in the liquid droplet ejecting system 10, when the liquid droplets are ejected to measure the amount of liquid droplets ejected from the droplet ejecting heads 111, that is, when the liquid droplets are ejected to the ejection-amount measuring liquid receivers 841, it is preferable that the ejection of liquid droplets be performed in an atmosphere in which the temperature and humidity (the environmental conditions) are controlled to be similar to the atmosphere in which the actual ejecting of the liquid droplets onto the substrate W occurs, by adjusting the temperature and humidity (the environmental conditions) in the chamber 91.

As a result, in the liquid droplet ejecting system 10, it is possible to more accurately perform measurement of the amount of liquid droplets without generating an error with respect to the amount of liquid droplets ejected in ejecting the liquid droplets onto the substrate W. Further, in the liquid droplet ejecting system 10, by adjusting the amount of liquid droplets based on the accurately measured value to be appropriate, it is possible to accurately (with high accuracy) approach (adjust) the amount of liquid droplets when the liquid droplets are actually ejected onto the substrate W, and it is thus possible to form (image) a pattern on the substrate W with higher accuracy.

In this embodiment, the ejection-amount measuring liquid receivers 841 have liquid absorbers 846 such as sponges capable of absorbing the received liquid droplets (liquid) therein. As a result, since the ejection-amount measuring liquid receivers 841 can hold therein the liquid droplets received from the droplet ejecting heads 111 without allowing the liquid droplets to fly in all directions, it is possible to more accurately perform the measurement without generating a measurement error. Furthermore, since the received liquid is absorbed by the liquid absorbers 846, the liquid is not spilled despite the shaking when the ejection-amount measuring liquid receivers 841 are detached and attached for measuring their weights, so that the handling is facilitated.

The ejection-amount measuring liquid receivers 841 are not limited to the above configuration, and may have a configuration such that a non-volatile liquid having a specific gravity less than that of the received ejection liquid is placed therein in advance and the liquid droplets are received in the non-volatile liquid.

In this embodiment, the base 843 has a height adjusting mechanism for adjusting the height of the support 842 with a screw. As a result, the height of the ejection-amount measuring liquid receivers 841 can be adjusted. By appropriately adjusting the distance between the droplet ejecting heads 111 and the ejection-amount measuring liquid receivers 841 using the height adjusting mechanism, it is possible to more accurately ensure that the liquid droplets do not fly in all directions.

The height adjusting mechanism of the ejection-amount measuring liquid receivers 841 may be constructed to automatically adjust the height by means of, for example, a pneumatic cylinder.

FIG. 12 is a piping system diagram illustrating the ejection liquid supply unit, the cleaning solution supply unit, and the liquid discharging unit in the liquid droplet ejecting apparatus shown in FIGS. 1 and 2; and FIG. 13 is a diagram schematically illustrating the configuration of the liquid amount detecting means. Now, the ejection liquid supply unit 4, the cleaning solution supply unit 50, and the liquid discharging unit 18 in the liquid droplet ejecting apparatus 1 will be described with reference to those figures and to FIG. 6.

First, the ejection liquid supply unit 4 for supplying the ejection liquid to be ejected from the droplet ejecting heads 111 will be described.

As shown in FIG. 12, the ejection liquid supply unit 4 comprises a primary tank system 40 for storing ejection liquid and one primary flow path 411 for connecting the primary tank system 40 to a secondary tank 412 that will be described later. The primary tank system 40 has a first primary tank 401 and a second primary tank 402 provided in the tank housing unit 13, an outflow pipe 403 connected to the first primary tank 401, an outflow pipe 404 connected to the second primary tank 402, and a three-way valve (flow path switching means) 405. The three-way valve 405 is connected to the primary flow path 411 and the outflow pipes 403 and 404. The ejection liquid supply unit 4 can selectively supply the ejection liquid from either the first primary tank 401 or the second primary tank 402 to the primary flow path 411 by switching the three-way valve 405.

The ejection liquid supply unit 4 further includes pressurizing means 406 for supplying pressurized gas to the first primary tank 401 and the second primary tank 402, pressurizing pipes 407 and 408 connected to the first primary tank 401 to the second primary tank 402, respectively, a pipe 410 from the pressurizing means 406, and a three-way valve (pressure path switching means) 409 connected to the above three pipes. As the pressurizing means 406, a pressurized gas source for supplying gas, such as pressurized nitrogen gas, etc., is used (pressurizing means 506, described later, is similar thereto). The ejection liquid supply unit 4 can selectively pressurize the inside of either the first primary tank 401 or the second primary tank 402 using the pressurizing means 406, by switching the three-way valve 409.

As shown in FIG. 6, the secondary tank 412 is fixedly provided in the main carriage 102. That is, the secondary tank 412 is moved in the X-axis direction, together with the main carriage 102. The secondary tank 412 is connected to the other end of the first flow path 411 extending from the three-way valve 405, and the ejection liquid of the primary tank system 40 flows into the secondary tank 412 through the first flow path 411.

The first flow path 411 is formed preferably out of a flexible tube. The middle portion of the first flow path 411 is provided with a relay unit 413 for relaying the primary flow path 411 such that a portion of the secondary tank 412 side of the primary flow path 411 is movable correspondingly to the movement of the secondary tank 412, being moved together with the main carriage 102.

The secondary tank 412 and the head unit 11 are connected to each other through twelve secondary flow paths 414 corresponding to the twelve droplet ejecting heads 111 provided in the head unit 11. That is, the head unit 11 is provided with the twelve inlets (connection holes) 112 corresponding to the respective droplet ejecting heads 111, and the other ends of the twelve secondary flow paths 414 extending from the secondary tank 412 are connected to the inlets 112, respectively. In FIG. 6, for the purpose of simplification, only two of the twelve secondary flow paths 414 are shown. Although the secondary flow paths 414 are formed of flexible tubes in the shown configuration, the secondary flow paths are not limited thereto, and may be formed of hard tubes.

The pressure of the secondary tank 412 is controlled by a pressure control unit (a negative pressure control unit), not shown, to be negative. The ejection liquid whose pressure is controlled in the secondary tank 412 is supplied to the respective droplet ejecting heads 111 through the respective secondary flow paths 414. As a result, the pressure of the ejection liquid to be supplied to the respective droplet ejecting heads 111 is controlled, so that a good ejecting condition of liquid droplets in the nozzles of the droplet ejecting heads 111 can be obtained.

Respective middle portions of the secondary flow paths 414 are provided with cut-off valves 415 for cutting off the respective flow paths. The cut-off valves 415 cut off the secondary flow paths 414 when the pressure control unit does not work due to any cause, so that the ejection liquid flows continuously into the droplet ejecting heads 111 at a position lower than that of the secondary tank 412 from the secondary tank 412, thereby preventing the ejection liquid from leaking from the droplet ejecting heads 111.

As shown in FIG. 13($a$), the ejection liquid supply unit 4 further includes liquid amount detecting means 416 for detecting the amount of liquid in the first primary tank 401. The liquid amount detecting means 416 includes an optically transparent tube 417, of which the inner cavity communicates with the inside of the first primary tank 401 and which is provided vertically outside the first primary tank 401, and a light-emitting portion 418 and a light-receiving portion 419 facing each other with the tube 417 therebetween in the vicinity of the bottom of the first primary tank 401.

When the amount of liquid in the first primary tank 401 is decreased by means of the variation of the amount of received light in the light receiving portion 419 to reach a predetermined lower limit level E (empty), the liquid amount detecting means 416 can detect it. The detection result of the liquid amount detecting means 416 is input into the control unit 16.

The ejection liquid supply unit 4 includes a similar liquid amount detecting means 420 for detecting the amount of liquid in the second primary tank 402. When the amount of liquid in the second primary tank 402 is decreased to reach a predetermined lower limit E, the liquid amount detecting means 420 detects it and inputs the detection result thereof to the control unit 16.

In the ejection liquid supply unit 4 in the state shown in FIG. 12, the first primary tank 401 is pressurized by means of the pressurizing means 406, and the ejection liquid in the first primary tank 401 is discharged through the outflow pipe 403 and the primary flow path 411 by means of the pressure, and supplied to the droplet ejecting heads 111.

When the ejection liquid in the first primary tank 401 is consumed and the liquid amount detecting means 416 detects that the first primary tank 401 is empty, the control unit 16 switches the three-way valve 405 and the three-way valve 409, respectively, based on the detection result. Accordingly, the pressurizing means 406 pressurizes the second primary tank 402, and the ejection liquid in the second primary tank 402 is discharged through the outflow pipe 404 and the primary flow path 411 by means of the pressure and is supplied to the droplet ejecting heads 111.

In the course of supplying the ejection liquid from the second primary tank 402, an operator separates the empty first primary tank 401 from the rack 131, refills the first primary tank with the ejection liquid, and then restores the first primary tank to the rack 131. Thereafter, when the liquid amount detecting means 420 detects that the second primary tank 402 is empty, the control unit 16 switches the three-way valve 405 and the three-way valve 409, respectively, to allow the ejection liquid to be supplied from the first primary tank 401. Then, in the course of supplying the ejection liquid from the first primary tank 401, an operator separates the empty second primary tank 402 from the rack 131 and refills the second primary tank with the ejection liquid.

It is preferable that when the first primary tank 401 and the second primary tank 402 are empty, the control unit 16 notify the operator to replace the tank (to re-charge the ejection liquid). The method for notification may include, for example, a method of displaying characters or graphic symbols on a manipulation panel (not shown), or a method of emitting a sound or voice. It is also preferable that an operator be notified as to which primary tank is empty by providing different characters, graphic symbols, sounds, or voices that distinguish between the empty state of the first primary tank 401 and the second primary tank 402.

As described above, since the ejection liquid supply unit 4 according to this embodiment uses both the first primary tank 401 and the second primary tank 402 while switching between them, the entire capacity can be increased, and it is thus possible to effectively cope with an increase in consumption of the ejection liquid following a growth in the size of the liquid droplet ejecting apparatus 1. Since the entire capacity can be increased without excessively increasing individual capacities of the first primary tank 401 and the second primary tank 402, excessive weights (specifically, weights when full) of the first primary tank 401 and the second primary tank 402, respectively, can be avoided, so that it is possible to reduce the burden of an operator when replacing the tanks.

Next, the cleaning solution supply unit 50 used in the cleaning unit 81 will be described, but the same elements as found in the ejection liquid supply unit 4 will be not described. As shown in FIG. 12, the cleaning solution supply unit 50 includes a first cleaning solution tank 501 and a second cleaning solution tank 502 provided in the tank housing unit 13, an outflow pipe 503 connected to the first cleaning solution tank 501, an outflow pipe 504 connected to the second cleaning solution tank 502, a three-way valve (flow path switching means) 505 to which the outflow pipes 503 and 504 and a liquid supply pipe 511 to the cleaning unit 81 are connected, respectively, pressurizing means 506 for supplying pressurized gas to the first cleaning solution tank 501 and the second primary tank 502, a pressuring pipe 507 connected to the first cleaning solution tank 501, a pressuring pipe 508 connected to the second cleaning solution tank 502, a three-way valve (pressurizing path switching means) 509 to which the pressurizing pipes 507 and 508 and a pipe (path) 510 from the pressurizing means 506 are connected, respectively, and liquid amount detecting means (not shown) for detecting the remaining amount of solution in the first cleaning solution tank 501 and the second cleaning solution tank 502. The downstream side of the liquid supply pipe 511 is divided into the respective branching tubules 41 connected to the nozzle unit 164 through a manifold, not shown.

Next, the liquid discharging unit 18 for recovering the discharged liquid (the ejection liquid) wastefully ejected from the droplet ejecting heads 111 in the before-imaging flushing unit 104, the regular flushing unit 82 and the dot-omission detecting unit 19 will be described, but the same elements as found in the liquid recovering unit 17, described later, will not be described.

As shown in FIG. 12, the liquid discharging unit 18 includes a first discharged liquid tank 181 and a second discharged liquid tank 182 (not shown in FIG. 9) provided in the tank housing unit 13, an inflow pipe 183 connected to the first discharged liquid tank 181, an inflow pipe 184 connected to the second discharged liquid tank 182, and a three-way valve (flow path switching means) 185.

The three-way valve 185 is connected to a liquid discharging pipe 186 into which suction tubes (not shown) from the before-imaging flushing unit 104, the regular flushing unit 82, and the dot-omission detecting unit 19 are merged, and the inflow pipes 183 and 184, respectively. The first discharged liquid tank 181 and the second discharged liquid tank 182 are provided with liquid amount detecting means (not shown) similar to the liquid amount detecting means 177a, 177b, described later, respectively.

In this embodiment, by means of the liquid discharging unit 18, the ejection liquid discharged from the before-imaging flushing unit 104, the regular flushing unit 82, and the dot-omission detecting unit 19 is recovered and stored in common. The ejection liquid recovered from the respective units is exposed once externally in the liquid receivers of the respective units, so that foreign materials (refuse) are mixed thereto, or the solvent is vaporized through contact with the external air to change the concentration thereof. Therefore, the ejection liquid is generally abolished. In this embodiment, since the liquid to be abolished is stored in the first discharged liquid tank 181 and the second discharged liquid tank 182 in common, the operation of abolishing the liquid is completed at the same time, thereby contributing to a reduction in labor of an operator.

Figure 21:
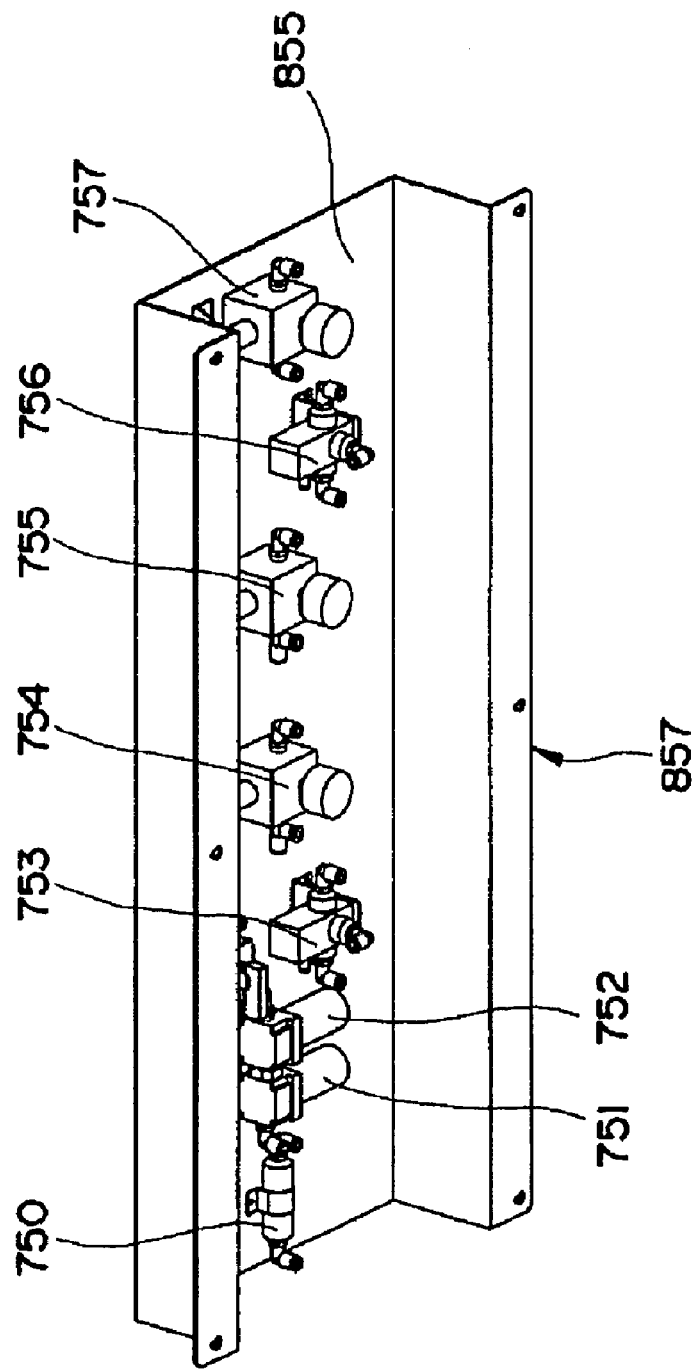
FIG. 21 is a perspective view illustrating fixed sections provided in the side surfaces of an accessory stand and relevant piping components provided therein according to a principle of the present invention.
Figure 22:
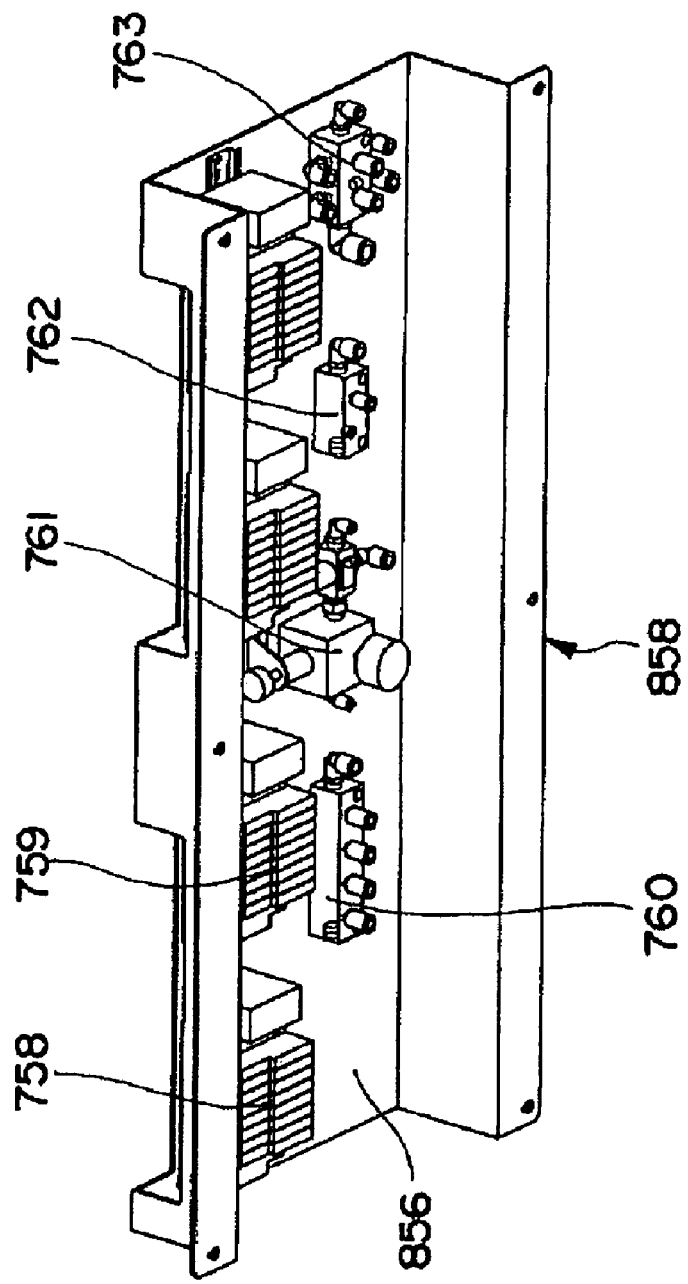
FIG. 22 is a perspective view illustrating the fixed sections provided in the side surfaces of the accessory stand and the relevant piping components provided therein according to a principle of the present invention.

FIGS. 21 and 22 are perspective views illustrating the fixed sections provided at the side surface of the accessory stand and the relevant piping components provided therein in the accessory apparatus shown in FIGS. 10 and 11, respectively.

As shown in FIG. 10, the side surfaces of the accessory stand 85 are provided with fixed sections (side wall sections) 855 and 856 to which the relevant piping components are fixed. The fixed sections 855 and 856 comprise parts of plate-shaped covers 857 and 858 covering the side surfaces of the accessory stand 85. The fixed sections 855 and 856 are placed at positions receding (recessed) inwardly from the total width (the total width in the X-axis direction) of the accessory stand 85.

As shown in FIG. 21, the fixed section 855 is provided with a clean gas filter 750, an air filter 751, a mist separator 752, a three-way valve (an air operated valve) 753, a regulator 754, a regulator 755, a three-way valve (an air operated valve) 756, a regulator 757, etc., as the relevant piping components used for the liquid droplet ejecting apparatus 1.

The air filter 751 and the mist separator 752 remove the foreign material and the liquid droplets contained in the pressurized gas (nitrogen) supplied from the pressurizing means 406, respectively. The pressure of the pressurized gas passing through the air filter 751 and the mist separator 752 is adjusted by means of the regulator 757, and the pressurized gas passes through the clean gas filter 750 and is supplied to the first primary tank 401 and the second primary tank 402.

The pressurized gas supplied from the pressurizing means 406 can be supplied to a pressurized tank (not shown) for storing the cleaning solution for cleaning the droplet ejecting heads and a pressurized tank (not shown) for storing the cleaning solution for cleaning the flow paths, by switching the three-way valves 753 and 756. The regulators 754 and 755 adjust the pressure of the pressurized gas supplied to the pressurized tank.

As shown in FIG. 22, the fixed section 856 is provided with manifold valves 758 and 759, an air supply manifold 760, a regulator for a liquid discharging process pump 761, a nitrogen discharging manifold 762, an air discharging manifold 763, etc., as the relevant piping components used for the liquid droplet ejecting apparatus 1.

The manifold valves 758 and 759 switch the three-way valves in the ejection liquid supply unit 4, the cleaning solution supply unit 50, a liquid discharging unit 18, a liquid recovering unit 17, etc., described above. The regulator for the liquid discharging process pump 761 adjusts the suctioning force of a process pump (not shown) provided in the liquid discharging unit 18, for suctioning the discharged liquid. The air supply manifold 760, the nitrogen discharging manifold 762 and the air discharging manifold 763 divide or merge the pneumatic flow paths for operating the aforementioned three-way valves or the pneumatic cylinders provided in the liquid droplet ejecting apparatus 1.

In this embodiment, by fixing various relevant piping components to the fixed sections 855 and 856 placed at the positions receding inwardly from the total width of the accessory stand 85, the relevant piping components are provided not to be protruded outwardly from the total width of the accessory stand 85. Accordingly, when an operator works in the vicinity of the accessory stand 85 (during replacement of the head unit 11, maintenance of the apparatus, etc.), it is possible to easily and smoothly perform maintenance without interfering with the relevant piping components.

In the liquid droplet ejecting apparatus 1 described above, the four kinds of droplet ejecting head maintenance units are arranged in a group on the movable platen 86 as the maintenance-unit installing section, but in the present invention, the dot-omission inspecting unit 19 that is a kind of droplet ejecting head maintenance unit may be further arranged in a group in the maintenance-unit installing section. The droplet ejecting head maintenance units are not limited to the five kinds described above, and may include other kinds of droplet ejecting head maintenance units (having other functions) only if they are used for the function maintenance, the function recovery, the adjustment or the inspection of the droplet ejecting heads 111. Further, in the present invention, at least three of the plurality of droplet ejecting head maintenance units may be arranged in a group in the maintenance-unit installing section.

Figure 23:
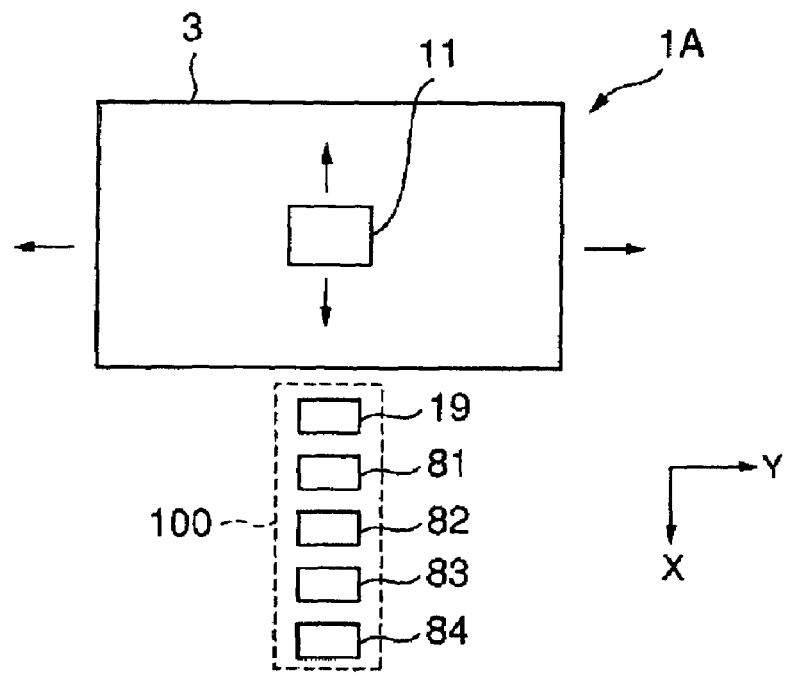
FIG. 23 is a plan view schematically illustrating another embodiment of the liquid droplet ejecting apparatus according to a principle of the present invention.
Figure 23:
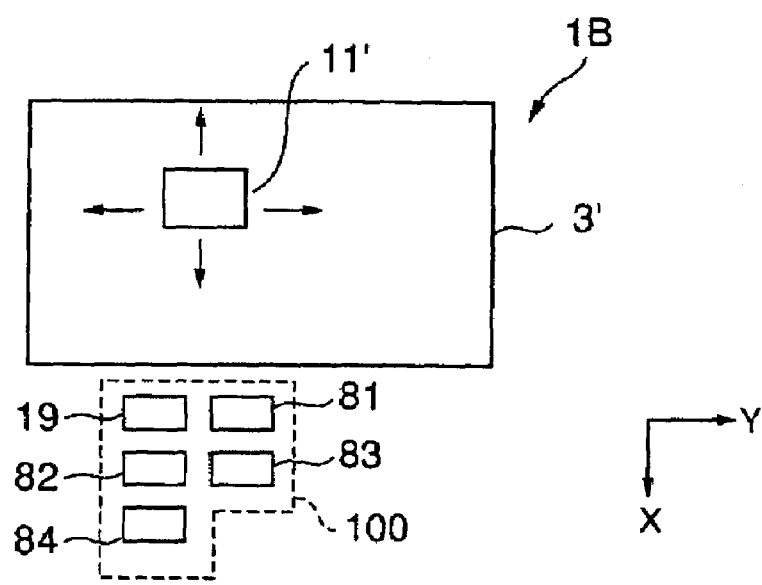

FIG. 23 is a plan view schematically illustrating another embodiment of the liquid droplet ejecting apparatus according to the present invention. Now, another embodiment of the liquid droplet ejecting apparatus according to the present invention will be described with reference to the above figure, but only the differences from the aforementioned embodiment will be briefly described, and the same details will be not described.

In a liquid droplet ejecting apparatus 1A shown in FIG. 23(a), the substrate-carrying table 3 is provided to be movable in the Y-axis direction, and the head unit 11 (the droplet ejecting heads 111) is provided to be movable in the X-axis direction, similarly to the aforementioned embodiment. In a droplet ejecting head maintenance-unit installing section 100 positioned below the area in which the head unit 11 is moved, the dot-omission detecting unit 19, the cleaning unit 81, the regular flushing unit 82, the capping unit 83, and the ejection-amount measuring unit 84 are arranged in the X-axis line in a group. By moving the head unit 11 in the X-axis direction, the head unit 11 can be positioned above the droplet ejecting head maintenance units. In the liquid droplet ejecting apparatus 1A, the maintenance-unit moving mechanism is not necessary, so that it is possible to simplify the structure thereof.

In a liquid droplet ejecting apparatus 1B shown in FIG. 23(b), a substrate table (a work mounting unit) 3' is provided fixedly in the main body, and a head unit 11' (droplet ejecting heads 111) is provided to be movable in the X-axis direction and the Y-axis direction, respectively. The liquid droplet ejecting apparatus 1B can perform the primary scanning and the secondary scanning by moving the head unit 11' over the substrate table 3' in the Y-axis direction and the X-axis direction, respectively.

In the droplet ejecting head maintenance-unit installing section 100 in the vicinity of the substrate table 3', the dot-omission detecting unit 19, the cleaning unit 81, the regular flushing unit 82, the capping unit 83, and the ejection-amount measuring unit 84 are arranged in a group to be adjacent to each other. By moving the head unit 11' in the droplet ejecting head maintenance-unit installing section 100 in the X-axis direction and the Y-axis direction, the head unit 11 can be positioned above the respective droplet ejecting head maintenance units. In the liquid droplet ejecting apparatus 1B, the maintenance-unit moving mechanism is not necessary, so that it is possible to simplify the structure thereof.

So far, the embodiments of the liquid droplet ejecting apparatus according to the present invention have been described, but the present invention is not limited to these embodiments. The respective elements constituting the liquid droplet ejecting apparatus may be replaced with any element having the same function. Further, any element may be added thereto.

The Y-axis movement mechanism and the X-axis movement mechanism may use, for example, a ball screw (a feed screw) instead of the linear motor.

Furthermore, in the liquid droplet ejecting apparatus according to the present invention, primary scanning and secondary scanning may be performed by fixing the head unit (droplet ejecting heads) to the main body and moving the work (work mounting unit) in the Y-axis direction and the X-axis direction, respectively. That is, it is enough that the liquid droplet ejecting apparatus according to the present invention comprises a relative movement mechanism for relatively moving the work mounting unit and the droplet ejecting heads.

An electro-optical device according to the present invention is manufactured using the liquid droplet ejecting apparatus according to the present invention described above. A specific example of the electro-optical device according to the present invention is not particularly limited, and may include, for example, a liquid crystal display device, an organic EL display device, etc.

Furthermore, a method of manufacturing an electro-optical device according to the present invention employs the liquid droplet ejecting apparatus according to the present invention. The method of manufacturing an electro-optical device according to the present invention can be applied, for example, to a method of manufacturing a liquid crystal display device. That is, by selectively ejecting a liquid containing filter materials for respective colors to a substrate by using the liquid droplet ejecting apparatus according to the present invention, a color filter in which a plurality of filter elements are arranged on the substrate can be manufactured, and the liquid crystal display device can be manufactured by using the color filter. In addition, the method of manufacturing an electro-optical device according to the present invention can be applied to a method of manufacturing, for example, an organic EL display device. That is, by selectively ejecting a liquid containing light-emitting materials for respective colors to a substrate by using the liquid droplet ejecting apparatus according to the present invention, an organic EL display device in which a plurality of pixels, including EL light-emitting layers, are arranged on the substrate can be manufactured.

Furthermore, an electronic apparatus according to the present invention comprises the electro-optical device manufactured in the aforementioned way. A specific example of the electronic apparatus according to the present invention is not particularly limited, and may include a personal computer, a mobile phone, etc., equipped with the liquid crystal display device or the organic EL display device manufactured in the aforementioned way.

What is claimed is:

1. A liquid droplet ejecting apparatus comprising:
   a main body;
   a work piece mounting unit on which a work piece is mounted;
   a droplet ejecting head for ejecting liquid droplets of an ejecting liquid to the work piece;
   a relative movement mechanism for moving the work piece mounting unit relative to the droplet ejecting head; and
   three or more droplet ejecting head maintenance units for function maintenance, function recovery, adjustment, or inspection of the droplet ejecting head,
   wherein at least three of the droplet ejecting head maintenance units are arranged in a group in a maintenance-unit installing section.

2. The liquid droplet ejecting apparatus according to claim 1, wherein four or more the droplet ejecting head maintenance units are provided, and
   wherein at least four droplet ejecting head maintenance units are arranged in a group in the maintenance-unit installing section.

3. The liquid droplet ejecting apparatus according to claim 1, wherein each of the droplet ejecting head maintenance units installed in the maintenance-unit installing section are at least one selected from the group consisting of a cleaning unit for cleaning a nozzle-formed surface of the droplet ejecting head, a a flushing unit having a liquid receiver for receiving a liquid wastefully ejected by the droplet ejecting head during a waiting period, a capping unit having a cap for covering the nozzle-formed surface of the droplet ejecting head in suctioning a fluid from the droplet ejecting head, an ejection-amount measuring unit for measuring the amount of liquid droplets ejected from the droplet ejecting head, and a dot-omission detecting unit for inspecting dot-omission of the droplet ejecting head.

4. The liquid droplet ejecting apparatus according to claim 1, wherein the droplet ejecting head maintenance units installed in the maintenance-unit installing section are arranged in parallel in a line.

5. The liquid droplet ejecting apparatus according to claim 1, further comprising a maintenance-unit moving mechanism for horizontally moving the maintenance-unit installing section.

6. The liquid droplet ejecting apparatus according to claim 5, wherein the droplet ejecting head is detachably installed in the main body, and
   the maintenance-unit moving mechanism moves the maintenance-unit installing section to a position where the droplet ejecting head maintenance units installed in the maintenance-unit installing section do not interfere with the droplet ejecting head during attachment and detachment of the droplet ejecting head.

7. The liquid droplet ejecting apparatus according to claim 5, wherein the relative movement mechanism comprises a Y-axis movement mechanism for moving the work piece mounting unit in a Y-axis direction relative to the main body, and an X-axis movement mechanism for moving the droplet ejecting head in an X-axis direction perpendicular to the Y-axis direction relative to the main body.

8. The liquid droplet ejecting apparatus according to claim 7, wherein one of the Y-axis direction and the X-axis direction is a primary scanning direction and the other is a secondary scanning direction; and
   the liquid droplets are ejected to the work piece from the droplet ejecting head while moving the work piece mounting unit relative to the droplet ejecting head.

9. The liquid droplet ejecting apparatus according to claim 7, further comprising a maintenance-unit moving mechanism for moving the maintenance-unit installing section in the Y-axis direction,
   wherein the droplet ejecting head maintenance units installed in the maintenance-unit installing section are arranged in a line in the Y-axis direction.

10. The liquid droplet ejecting apparatus according to claim 1, further comprising a height adjusting mechanism for adjusting the height of the maintenance-unit installing section.

11. The liquid droplet ejecting apparatus according to claim 5, wherein the work piece mounting unit, the droplet ejecting head, and the relative movement mechanism are supported by the main body, and the maintenance-unit installing section is supported by an accessory stand physically separated from the main body.

12. The liquid droplet ejecting apparatus according to claim 11, wherein the main body has a surface plate, and the work piece mounting unit, the droplet ejecting head, and the relative movement mechanism are supported by the surface plate.

13. The liquid droplet ejecting apparatus according to claim 11, wherein a side surface of the accessory stand is provided with piping components for the liquid droplet ejecting apparatus, and the piping components are installed to not protrude outward from a total width of the accessory stand by fixing the piping components to fixed sections provided at positions receding inward from the total width of the accessory stand.

14. The liquid droplet ejecting apparatus according to claim 1, wherein a predetermined pattern is formed on the work piece by ejecting liquid droplets from the droplet ejecting head while moving the work piece mounting unit relative to the droplet ejecting head.

* * * * *